United States Patent
Sonoda et al.

(10) Patent No.: US 8,859,438 B2
(45) Date of Patent: Oct. 14, 2014

(54) VAPOR DEPOSITION METHOD, VAPOR DEPOSITION DEVICE AND ORGANIC EL DISPLAY DEVICE

(75) Inventors: Tohru Sonoda, Osaka (JP); Shinichi Kawato, Osaka (JP); Satoshi Inoue, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 13/824,617

(22) PCT Filed: Sep. 15, 2011

(86) PCT No.: PCT/JP2011/071123
§ 371 (c)(1),
(2), (4) Date: Mar. 18, 2013

(87) PCT Pub. No.: WO2012/043258
PCT Pub. Date: Apr. 5, 2012

(65) Prior Publication Data
US 2013/0181209 A1 Jul. 18, 2013

(30) Foreign Application Priority Data
Sep. 27, 2010 (JP) .................................. 2010-215152

(51) Int. Cl.
*H01L 21/31* (2006.01)
*H05B 33/10* (2006.01)
(Continued)

(52) U.S. Cl.
CPC ............... *H01L 33/44* (2013.01); *H05B 33/10* (2013.01); *H01L 27/3211* (2013.01);
(Continued)

(58) Field of Classification Search
USPC ............... 257/40, 89; 438/34, 758; 118/720
See application file for complete search history.

(56) References Cited

U.S. PATENT DOCUMENTS 5,742,129 A 4/1998 Nagayama et al.
6,294,892 B1 9/2001 Utsugi et al.
(Continued)

FOREIGN PATENT DOCUMENTS

JP 8-227276 A 9/1996
JP 2000-188179 A 7/2000
(Continued)

OTHER PUBLICATIONS

International Search Report received for PCT Patent Application No. PCT/JP2011/071123, mailed on Nov. 22, 2011, 5 pages (2 pages of English Translation and 3 pages of Search Report).

*Primary Examiner* — Zandra Smith
*Assistant Examiner* — Jamie C Niesz
(74) *Attorney, Agent, or Firm* — Morrison & Foerster LLP

(57) ABSTRACT

A coating film (90) is formed by causing vapor deposition particles (91) to pass through a mask opening (71) of a vapor deposition mask and adhere to a substrate, the vapor deposition particles (91) being discharged from a vapor deposition source opening (61) of a vapor deposition source (60) while the substrate (10) is moved relative to the vapor deposition mask (70) in a state in which the substrate (10) and the vapor deposition mask (70) are spaced apart at a fixed interval. When a direction that is orthogonal to a normal line direction of the substrate and is orthogonal to a relative movement direction of the substrate is defined as a first direction, and the normal line direction of the substrate is defined as a second direction, a plurality of control plate columns are disposed in the first direction between the vapor deposition source opening and the vapor deposition mask, each control plate column including a plurality of control plates (80a and 80b) arranged along the second direction. With this configuration, a coating film in which blur at both edges of the coating film and variations in the blur are suppressed can be formed on a large-sized substrate.

13 Claims, 22 Drawing Sheets

(51) Int. Cl.
*H01L 33/44* (2010.01)
*C23C 14/24* (2006.01)
*C23C 14/04* (2006.01)
*C23C 14/12* (2006.01)
*H01L 27/32* (2006.01)
*H01L 51/00* (2006.01)
*H01L 51/56* (2006.01)

(52) U.S. Cl.
CPC ............... *C23C 14/24* (2013.01); *C23C 14/042* (2013.01); *H01L 51/0011* (2013.01); *C23C 14/12* (2013.01); *H01L 51/56* (2013.01); *H01L 51/0008* (2013.01)
USPC ................. 438/758; 257/40; 257/89; 438/34; 118/720

(56) References Cited

U.S. PATENT DOCUMENTS

| | | |
|---|---|---|
| 2004/0115338 A1 | 6/2004 | Yoneda |
| 2006/0186804 A1 | 8/2006 | Sakakura et al. |
| 2010/0297349 A1* | 11/2010 | Lee et al. ............... 427/248.1 |
| 2011/0033964 A1* | 2/2011 | Oh et al. ............... 438/34 |
| 2011/0048320 A1 | 3/2011 | Choi et al. |
| 2011/0168986 A1 | 7/2011 | Lee et al. |
| 2011/0186820 A1 | 8/2011 | Kim et al. |
| 2011/0220022 A1 | 9/2011 | Hong et al. |

FOREIGN PATENT DOCUMENTS

| | | |
|---|---|---|
| JP | 2004-103269 A | 4/2004 |
| JP | 2004-169066 A | 6/2004 |
| JP | 2006-261109 A | 9/2006 |
| JP | 2009-228090 A | 10/2009 |
| JP | 2011-32579 A | 2/2011 |
| JP | 2011-52318 A | 3/2011 |
| JP | 2011-146377 A | 7/2011 |
| JP | 2011-157625 A | 8/2011 |
| JP | 2011-190536 A | 9/2011 |

* cited by examiner

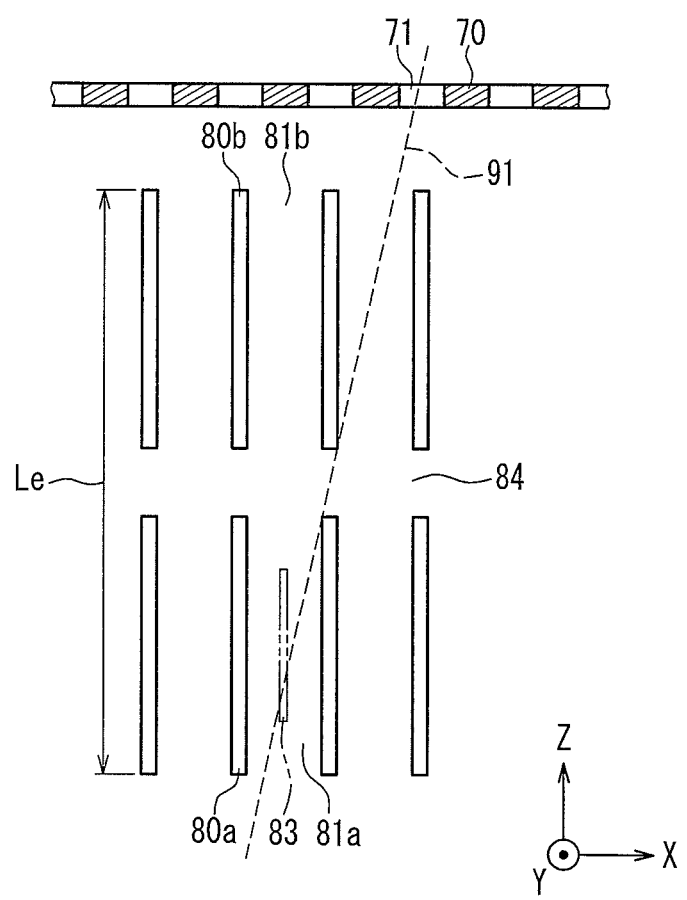
F I G. 14

VAPOR DEPOSITION METHOD, VAPOR DEPOSITION DEVICE AND ORGANIC EL DISPLAY DEVICE

CROSS REFERENCE TO RELATED APPLICATIONS

This is a U.S. National Phase patent application of PCT/JP2011/071123, filed Sep. 15, 2011, which claims priority to Japanese Patent Application No. 2010-215152, filed Sep. 27, 2010, each of which is hereby incorporated by reference in the present disclosure in its entirety.

TECHNICAL FIELD

The present invention relates to a vapor deposition method and a vapor deposition device for forming a coating film having a predetermined pattern on a substrate. The present invention also relates to an organic EL (Electro Luminescence) display device including a light emitting layer formed by vapor deposition.

BACKGROUND ART

In recent years, flat panel displays are used in various commodity products and fields, and thus flat panel displays are required to have a large size, high image quality and low power consumption.

Under the circumstances, organic EL display devices, which include an organic EL element that utilizes electro luminescence of an organic material, are attracting great attention as all-solid state flat panel displays that are excellent as having capability of low voltage operation, quick responsivity and light emission.

Active matrix type organic EL display devices, for example, are provided with a thin film-like organic EL element on a substrate having a TFT (thin film transistor). In the organic EL element, organic EL layers including a light emitting layer are laminated between a pair of electrodes. The TFT is connected to one of the pair of electrodes. Then, voltage is applied across the pair of electrodes so as to cause the light emitting layer to emit light, whereby an image is displayed.

In a full-color organic EL display device, generally, organic EL elements including light emitting layers of respective colors of red (R), green (G) and blue (B) are formed and arranged on a substrate as sub-pixels. By causing these organic EL elements to selectively emit light at the desired brightness by using the TFT, a color image is displayed.

In order to manufacture an organic EL display device, it is necessary to form a light emitting layer made of organic light emitting materials that emit respective colors in a predetermined pattern for each organic EL element.

Known methods for forming light emitting layers in a predetermined pattern are vacuum vapor deposition method, inkjet method and laser transfer method. For example, the vacuum vapor deposition method is often used for low molecular organic EL display devices (OLEDs).

In the vacuum vapor deposition method, a mask (also called a "shadow mask") having a predetermined pattern of openings is used. The deposition surface of a substrate having the mask closely fixed thereto is disposed so as to oppose a vapor deposition source. Then, vapor deposition particles (film forming material) from the vapor deposition source are deposited onto the deposition surface through the openings of the mask, whereby a predetermined pattern of a thin film is formed. Vapor deposition is performed for each color of the light emitting layer, which is referred to as "vapor deposition by color".

For example, Patent Documents 1 and 2 disclose a method for performing vapor deposition by color in which light emitting layers for respective colors are formed by sequentially moving a mask with respect to a substrate. With such a method, a mask having a size equal to that of a substrate is used, and the mask is fixed so as to cover the deposition surface of the substrate at the time of vapor deposition.

CITATION LIST

Patent Document

Patent Document 1: JP H8-227276A
Patent Document 2: JP 2000-188179A
Patent Document 3: JP 2004-169066A
Patent Document 4: JP 2004-103269A

DISCLOSURE OF INVENTION

Problem to be Solved by the Invention

With conventional methods for performing vapor deposition by color as described above, as the substrate becomes larger, the mask needs to be large accordingly. However, when the mask is made large, a gap is likely to appear between the substrate and the mask by the mask being bent by its own weight or being extended. In addition, the size of the gap varies depending on the position of the deposition surface of the substrate. For this reason, it is difficult to perform highly accurate patterning, and it is therefore difficult to achieve high definition due to the occurrence of positional offset between the mask and the substrate during vapor deposition and the occurrence of color mixing.

Also, when the mask is made large, the mask as well as a frame or the like for holding the mask need to be gigantic, which increases the weight and makes handling thereof difficult. As a result, there is a possibility that productivity and safety might be compromised. Also, the vapor deposition device and devices that are used together therewith need to be made gigantic and complex as well, which makes device designing difficult and increases the installation cost.

For the reasons described above, the conventional methods for vapor deposition by color are difficult to adapt to large-sized substrates, and no methods have been devised that can perform vapor deposition by color on large-sized substrates such as those having a size exceeding 60 inches on a mass manufacturing level.

Meanwhile, with the vapor deposition method, if there is a gap between the substrate and the mask, blur may occur at the edge of a formed coating film due to the vapor deposition material extending beyond the edge of the coating film.

In an organic EL display device, if blur occurs at the edge of a light emitting layer formed by vapor deposition by color, the vapor deposition material adheres to the neighboring light emitting layer having a different color, causing color mixing. In order to prevent color mixing from occurring, it is necessary to increase the non-light-emitting region by reducing the opening width of pixels or increasing the pixel pitch. However, reduction of the opening width of pixels reduces brightness. If the current density is increased in order to obtain the required brightness, the service life of the organic EL element may be shortened, or the organic EL element may be easily damaged, reducing reliability. On the other hand, if the pixel pitch is increased, display of high definition images cannot be achieved, and the display quality decreases.

Thus, it is desirable to prevent blur at the edge of the coating film and its variations.

Also, it is desirable to reduce the vapor deposition material that is to be wastefully consumed to improve the utilization efficiency of the vapor deposition material, thus manufacturing an organic EL display device at low cost.

It is an object of the present invention to provide a vapor deposition method and a vapor deposition device that can stably form, with high utilization efficiency of the vapor deposition material, a coating film in which edge blur and its variations are suppressed and that can be applied to large-sized substrates.

It is another object of the present invention to stably provide an organic EL display device that is excellent in terms of reliability and display quality, at low cost.

Means for Solving Problem

A vapor deposition method according to the present invention is a vapor deposition method for forming a coating film having a predetermined pattern on a substrate, and the method includes a vapor deposition step of forming the coating film by causing vapor deposition particles to adhere onto the substrate. The vapor deposition step is a step in which with the use of a vapor deposition unit including a vapor deposition source having a vapor deposition source opening that discharges the vapor deposition particles and a vapor deposition mask disposed between the vapor deposition source opening and the substrate, the vapor deposition particles that have passed through a plurality of mask openings formed in the vapor deposition mask are caused to adhere onto the substrate while one of the substrate and the vapor deposition unit is moved relative to the other in a state in which the substrate and the vapor deposition mask are spaced apart at a fixed interval. When a direction that is orthogonal to a normal line direction of the substrate and is orthogonal to a relative movement direction of the substrate and the vapor deposition unit is defined as a first direction and the normal line direction of the substrate is defined as a second direction, a plurality of control plate columns are disposed in the first direction between the vapor deposition source opening and the vapor deposition mask, each control plate column including a plurality of control plates arranged along the second direction.

A vapor deposition device according to the present invention is a vapor deposition device that forms a coating film having a predetermined pattern on a substrate, the device including a vapor deposition unit including a vapor deposition source having a vapor deposition source opening that discharges vapor deposition particles for forming the coating film and a vapor deposition mask disposed between the vapor deposition source opening and the substrate, and a moving mechanism that moves one of the substrate and the vapor deposition unit relative to the other in a state in which the substrate and the vapor deposition mask are spaced apart at a fixed interval. When a direction that is orthogonal to a normal line direction of the substrate and is orthogonal to a relative movement direction of the substrate and the vapor deposition unit is defined as a first direction and the normal line direction of the substrate is defined as a second direction, a plurality of control plate columns are disposed in the first direction between the vapor deposition source opening and the vapor deposition mask, each control plate column including a plurality of control plates arranged along the second direction.

An organic EL display device according to the present invention includes a light emitting layer formed by using the above vapor deposition method.

Effects of the Invention

According to the vapor deposition method and vapor deposition device of the present invention, the vapor deposition particles that have passed through the mask openings formed in the vapor deposition mask are caused to adhere to the substrate while one of the substrate and the vapor deposition unit is moved relative to the other, and therefore a vapor deposition mask that is smaller than the substrate can be used. It is therefore possible to form a coating film even on a large-sized substrate by vapor deposition.

Because the open area ratio of the plurality of control plate columns is larger than the open area ratio of the conventional shadow mask, the utilization efficiency of the vapor deposition material can be improved.

Also, the plurality of control plate columns provided between the vapor deposition source opening and the vapor deposition mask selectively capture the vapor deposition particles that have entered a space between neighboring control plates in the first direction according to the incidence angle of the vapor deposition particles, and thus only the vapor deposition particles entering at a predetermined incidence angle or less enter the mask openings. As a result, the maximum incidence angle of the vapor deposition particles with respect to the substrate becomes small, and it is therefore possible to suppress blur that occurs at the edge of the coating film formed on the substrate.

Furthermore, because the control plate column is configured by arranging the plurality of control plates along the second direction, each control plate is short and light weight. Therefore, deformation or displacement due to the weight of the control plate, thermal expansion of the control plate does not often occur. Thus, it is possible to prevent variations in blur at the edges of the coating film from increasing and to suppress the blur. Also, since it is not necessary to reduce an interval between the control plate columns in order to suppress blur, it is possible to suppress the blur without a noticeable reduction in the utilization efficiency of the vapor deposition material.

The organic EL display device of the present invention includes a light emitting layer formed by using the vapor deposition method described above, and therefore edge blur in the light emitting layer and its variations are suppressed. Accordingly, it is possible to stably provide an organic TFT display device that has excellent reliability and display quality and that can be made in a large size, at low cost.

BRIEF DESCRIPTION OF DRAWINGS

FIG. 14 is a diagram for illustrating the action of a correction plate in the vapor deposition device according to Embodiment 1 of the present invention.

DESCRIPTION OF THE INVENTION

Figure 1:
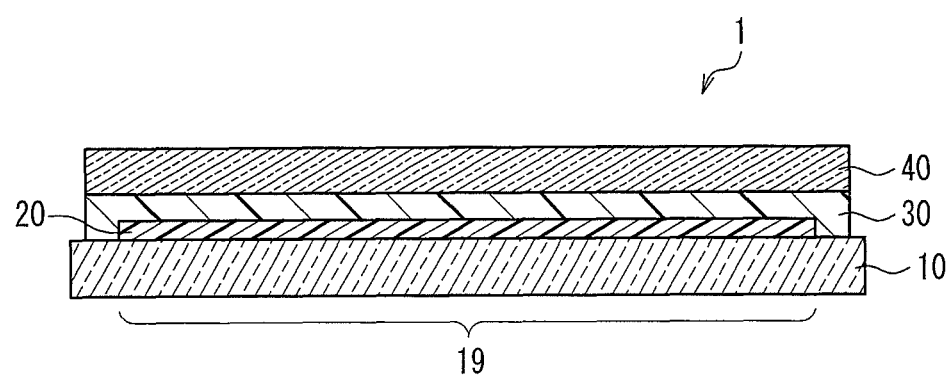
FIG. 1 is a cross-sectional view showing a schematic configuration of an organic EL display device.

A vapor deposition method according to the present invention is a vapor deposition method for forming a coating film having a predetermined pattern on a substrate and includes a vapor deposition step of forming the coating film by causing vapor deposition particles to adhere onto the substrate The vapor deposition step is a step in which with the use of a vapor deposition unit including a vapor deposition source having a vapor deposition source opening that discharges the vapor deposition particles and a vapor deposition mask disposed between the vapor deposition source opening and the substrate, the vapor deposition particles that have passed through a plurality of mask openings formed in the vapor deposition mask are caused to adhere onto the substrate while one of the substrate and the vapor deposition unit is moved relative to the other in a state in which the substrate and the vapor deposition mask are spaced apart at a fixed interval. When a direction that is orthogonal to a normal line direction of the substrate and is orthogonal to a relative movement direction of the substrate and the vapor deposition unit is defined as a first direction and the normal line direction of the substrate is defined as a second direction, a plurality of control plate columns are disposed in the first direction between the vapor deposition source opening and the vapor deposition mask, each control plate column including a plurality of control plates arranged along the second direction.

In the vapor deposition method of the present invention, it is preferable that a correction plate is disposed in a space between neighboring control plates in the first direction.

With this preferable configuration, the correction plate can exclude the vapor deposition particles passing through the gap between opposing control plates in the second direction and reaching the substrate, and thus the blur formed at the edge of the coating film can be effectively suppressed.

In this case, it is preferable that the correction plate is disposed so as to prevent, among the vapor deposition particles discharged from the vapor deposition source opening, those that have passed through a gap between opposing control plates in the second direction from adhering to the substrate and forming the coating film.

With this preferable configuration, the blur formed at the edge of the coating film can be suppressed more reliably.

It is preferable that the correction plate is disposed at a center between the neighboring control plates in the first direction.

With this preferable configuration, the required number of correction plates can be minimized.

It is preferable that the correction plate is disposed on the substrate side of a lower end of the gap between opposing control plates in the second direction.

With this preferable configuration, the distance in the second direction between the vapor deposition source opening and the correction plate can be increased, and thus reduction in the utilization efficiency of the vapor deposition material caused by the use of the correction plate can be made small.

It is possible that the plurality of control plate columns are configured so as to prevent, among the vapor deposition particles discharged from the vapor deposition source opening, those that have passed through a gap between opposing control plates in the second direction from adhering to the substrate and forming the coating film.

With this preferable configuration, the blur formed at the edge of the coating film can be suppressed more reliably without the use of the correction plate.

It is preferable that the correction plate is movable in the second direction. Also, it is preferable that at least one of the plurality of control plates arranged along the second direction is movable in the second direction.

With this preferable configuration, the width of the blur formed at the edge of the coating film can be changed without replacing the correction plate and/or the control plates.

It is preferable that the coating film is a light emitting layer for an organic EL element.

With this preferred configuration, it is possible to provide an organic EL display device in which the occurrence of color mixing and nonuniform light emission is suppressed.

Hereinafter, the present invention will be described in detail by showing preferred embodiments and examples. It should be noted, however, that the present invention is not limited to the following embodiments and examples. For the sake of convenience of the description, the drawings referred to hereinafter show only the principal members required to describe the present invention in simplified form among the constituent members of the embodiments and the examples of the present invention. Accordingly, the present invention may include arbitrary constituent members that are not shown in the following drawings. Also, the dimensions of the members in the drawings do not faithfully represent the actual dimensions or dimensional proportions of the constituent members.

(Configuration of Organic EL Display Device)

An example of an organic EL display device that can be manufactured by applying the present invention will be described. This organic EL display device is a bottom emission type organic EL display device in which light is extracted from the TFT substrate side and that displays full color images by controlling light emission of red (R), green (G) and blue (B) pixels (sub-pixels).

First, the overall configuration of the organic EL display device will be described below.

Figure 2:
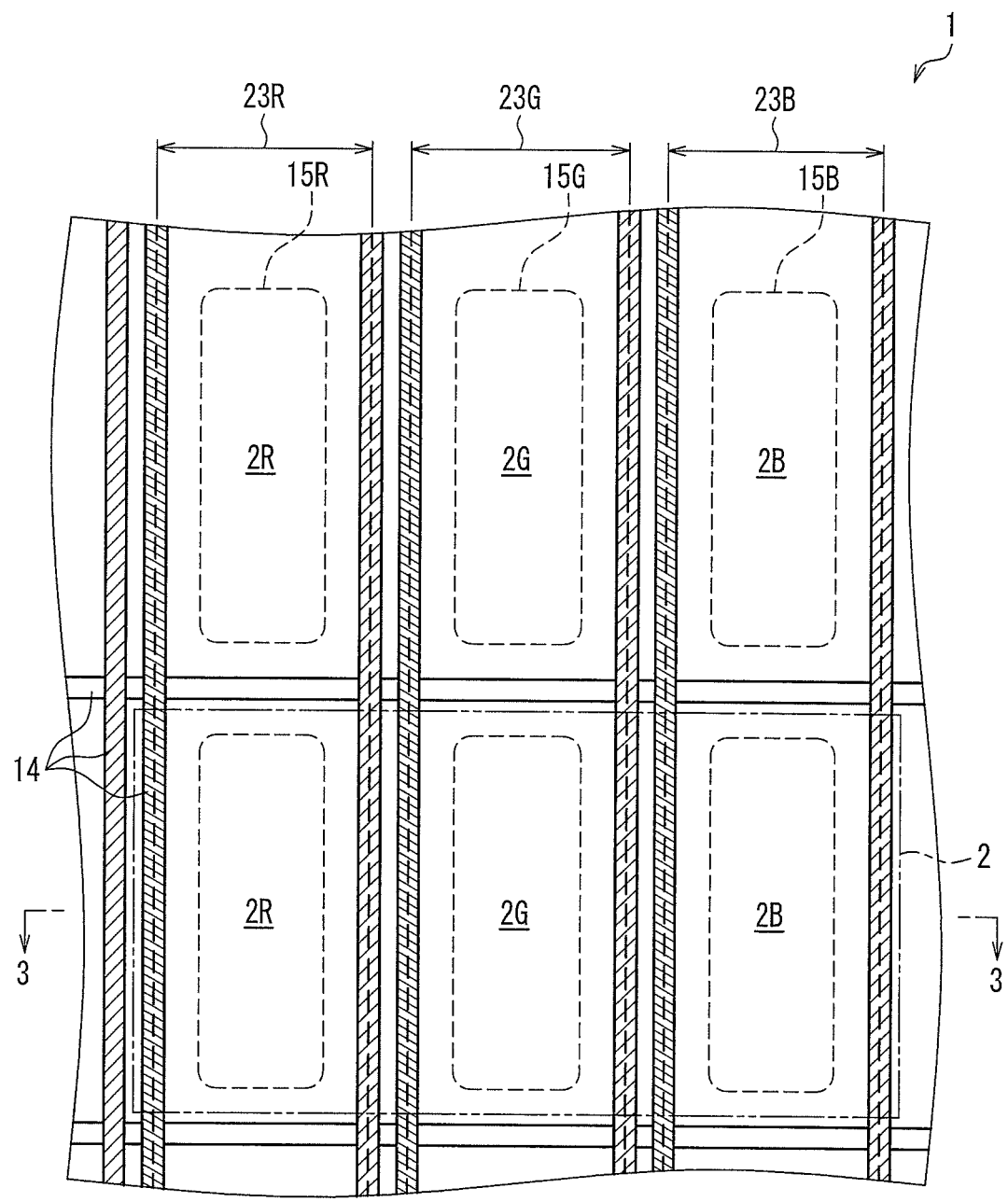
FIG. 2 is a plan view showing a configuration of pixels that constitute the organic EL display device shown in FIG. 1.
Figure 3:
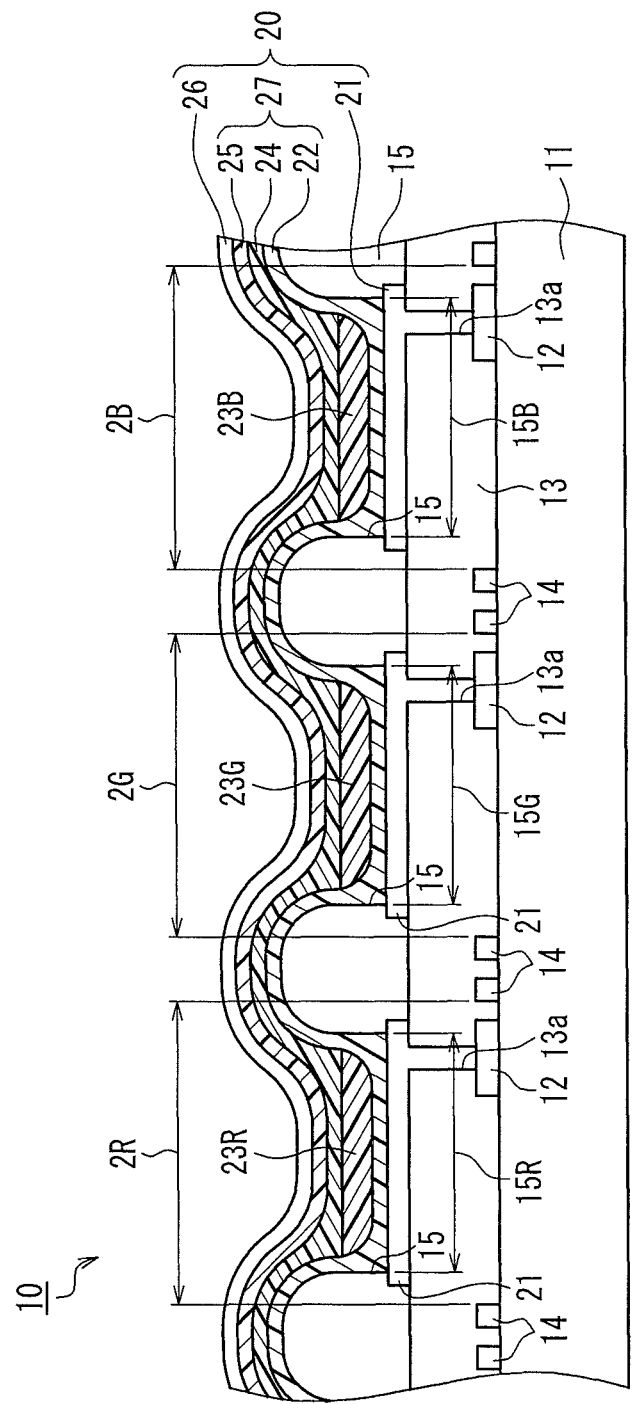
FIG. 3 is a cross-sectional view of a TFT substrate that constitutes the organic TFT display device taken along the line 3-3 of FIG. 2.

FIG. 1 is a cross-sectional view showing a schematic configuration of the organic EL display device. FIG. 2 is a plan view showing a configuration of pixels that constitute the organic EL display device shown in FIG. 1. FIG. 3 is a cross-sectional view of a TFT substrate that constitutes the organic EL display device, taken along the line III-III of FIG. 2.

As shown in FIG. 1, the organic EL display device 1 has a configuration in which, on a TFT substrate 10 provided with a TFT 12 (see FIG. 3), an organic EL element 20 connected to the TFT 12, an adhesive layer 30 and a sealing substrate 40 are provided in this order. A display region 19 in which images are displayed is located in the center of the organic EL display device 1, and the organic EL element 20 is disposed within the display region 19.

The organic EL element 20 is enclosed between a pair of substrates, namely, the TFT substrate 10 and the sealing substrate 40, by the TFT substrate 10 having the organic EL element 20 laminated thereon being bonded to the sealing substrate 40 with the use of the adhesive layer 30. By the organic EL element 20 being enclosed between the TFT substrate 10 and the sealing substrate 40 as described above, oxygen and moisture are prevented from entering the organic EL element 20 from the outside.

As shown in FIG. 3, the TFT substrate 10 includes, as a support substrate, a transparent insulating substrate 11 such as a glass substrate, for example. In the case of a top emission type organic EL display device, however, the insulating substrate 11 is not necessarily transparent.

As shown in FIG. 2, on the insulating substrate 11, a plurality of wires 14 are provided that include a plurality of gate lines provided in the horizontal direction and a plurality of signal lines intersecting the gate lines and provided in the perpendicular direction. A gate line driving circuit (not shown) that drives the gate lines is connected to the gate lines, and a signal line driving circuit (not shown) that drives the signal lines are connected to the signal lines. On the insulating substrate 11, red (R), green (G) and blue (B) sub-pixels 2R, 2G and 2B made of the organic EL element 20 are disposed in a matrix in respective regions surrounded by the wires 14.

The sub-pixels 2R emit red light, the sub-pixels 2G emit green light, and the sub-pixels 2B emit blue light. Sub-pixels of the same color are disposed in a column direction (up-down direction in FIG. 2) and a repeating unit consisting of sub-pixels 2R, 2G and 2B is repeatedly disposed in a row direction (right-left direction in FIG. 2). The sub-pixels 2R, 2G and 2B constituting a repeating unit in the row direction constitute a pixel 2 (specifically, a single pixel).

The sub-pixels 2R, 2G and 2B respectively include light emitting layers 23R, 23G and 23B that emit respective colors. The light emitting layers 23R, 23G and 23B are provided to extend in stripes in the column direction (up-down direction in FIG. 2).

A configuration of the TFT substrate 10 will be described.

As shown in FIG. 3, the TFT substrate 10 includes, on the transparent insulating substrate 11 such as a glass substrate, the TFT 12 (switching element), the wires 14, an inter-layer film 13 (inter-layer insulating film, planarized film), an edge cover 15, and so on.

The TFT 12 functions as a switching element that controls light emission of the sub-pixels 2R, 2G and 2B, and is provided for each of the sub-pixels 2R, 2G and 2B. The TFT 12 is connected to the wires 14.

The inter-layer film 13 also functions as a planarized film, and is laminated over the display region 19 of the insulating substrate 11 so as to cover the TFT 12 and the wires 14.

A first electrode 21 is formed on the inter-layer film 13. The first electrode 21 is electrically connected to the TFT 12 via a contact hole 13a formed in the inter-layer film 13. p The edge cover 15 is formed on the inter-layer film 13 so as to cover pattern ends of the first electrode 21. The edge cover 15 is an insulating layer for preventing short-circuiting between the first electrode 21 and a second electrode 26 that constitute the organic EL element 20 caused by an organic EL layer 27 becoming thin or the occurrence of electric field concentration at the pattern ends of the first electrode 21.

The edge cover 15 has openings 15R, 15G and 15B for the sub-pixels 2R, 2G and 2B. The openings 15R, 15G and 15B of the edge cover 15 serve as light emitting regions of the sub-pixels 2R, 2G and 2B. To rephrase, the sub-pixels 2R, 2G and 2B are partitioned by the edge cover 15 that is insulative. The edge cover 15 also functions as an element separation film.

The organic EL element 20 will be described.

The organic EL element 20 is a light emitting element capable of emitting highly bright light by low voltage direct current driving, and includes the first electrode 21, the organic EL layer 27 and the second electrode 26 in this order.

The first electrode 21 is a layer having a function of injecting (supplying) holes into the organic EL layer 27. As described above, the first electrode 21 is connected to the TFT 12 via the contact hole 13a.

As shown in FIG. 3, the organic EL layer 27 includes, between the first electrode 21 and the second electrode 26, a hole injection and transport layer 22, the light emitting layers 23R, 23G, 23B, an electron transport layer 24 and an electron injection layer 25 in this order from the first electrode 21 side.

In the present embodiment, the first electrode 21 serves as a positive electrode and the second electrode 26 serves as a negative electrode, but the first electrode 21 may serve as a negative electrode and the second electrode 26 may serve as a positive electrode. In this case, the order of the layers constituting the organic EL layer 27 is reversed.

The hole injection and transport layer 22 functions both as a hole injection layer and a hole transport layer. The hole injection layer is a layer having a function of enhancing the efficiency of injecting holes into the organic EL layer 27. The hole transport layer is a layer having a function of enhancing the efficiency of transporting holes to the light emitting layers 23R, 23G and 23B. The hole injection and transport layer 22 is formed uniformly over the display region 19 in the TFT substrate 10 so as to cover the first electrode 21 and the edge cover 15.

In the present embodiment, the hole injection and transport layer 22 in which a hole injection layer and a hole transport layer are integrated together is provided, but the present invention is not limited thereto, and the hole injection layer and the hole transport layer may be formed as independent layers.

On the hole injection and transport layer 22, the light emitting layers 23R, 23G and 23B are formed correspondingly to the columns of the sub-pixels 2R, 2G and 2B so as to cover the openings 15R, 15G and 15B of the edge cover 15, respectively. The light emitting layers 23R, 23G and 23B are layers having a function of emitting light by recombining holes injected from the first electrode 21 side and electrons injected from the second electrode 26 side. The light emitting layers 23R, 23G and 23B each contain a material having a high light-emission efficiency such as a low-molecular fluorescent dye or a metal complex.

The electron transport layer 24 is a layer having a function of enhancing the efficiency of transporting electrons from the second electrode 26 to the light emitting layers 23R, 23G and 23B.

The electron injection layer 25 is a layer having a function of enhancing the efficiency of injecting electrons from the second electrode 26 to the organic EL layer.

The electron transport layer 24 is formed uniformly over the display region 19 in the TFT substrate 10 such that it is on the light emitting layers 23R, 23G and 23B and the hole injection and transport layer 22 so as to cover the light emitting layers 23R, 23G and 23B and the hole injection and transport layer 22. Likewise, the electron injection layer 25 is formed uniformly over the display region 19 in the TFT substrate 10 such that it is on the electron transport layer 24 so as to cover the electron transport layer 24.

In the present embodiment, the electron transport layer 24 and the electron injection layer 25 are provided as independent layers, but the present invention is not limited thereto, and they may be provided as a single layer (specifically, an electron transport and injection layer) in which the electron transport layer 24 and the electron injection layer 25 are integrated together.

The second electrode 26 is a layer having a function of injecting electrons into the organic EL layer 27. The second electrode 26 is formed uniformly over the display region 19 in the TFT substrate 10 such that it is on the electron injection layer 25 so as to cover the electron injection layer 25.

An organic layer other than the light emitting layers 23R, 23G and 23B is not essential to the organic EL layer 27, and may be selected or omitted according to the characteristics required of the organic EL element 20. The organic EL layer 27 may further include a carrier blocking layer if necessary. By adding a hole blocking layer serving as a carrier blocking layer between the electron transport layer 24 and the light emitting layer 23R, 23G, 23B, for example, it is possible to prevent holes from escaping to the electron transport layer 24, whereby light-emission efficiency can be improved.

(Manufacturing Method for Organic EL Display Device)

A method for manufacturing an organic EL display device 1 will be described below.

Figure 4:
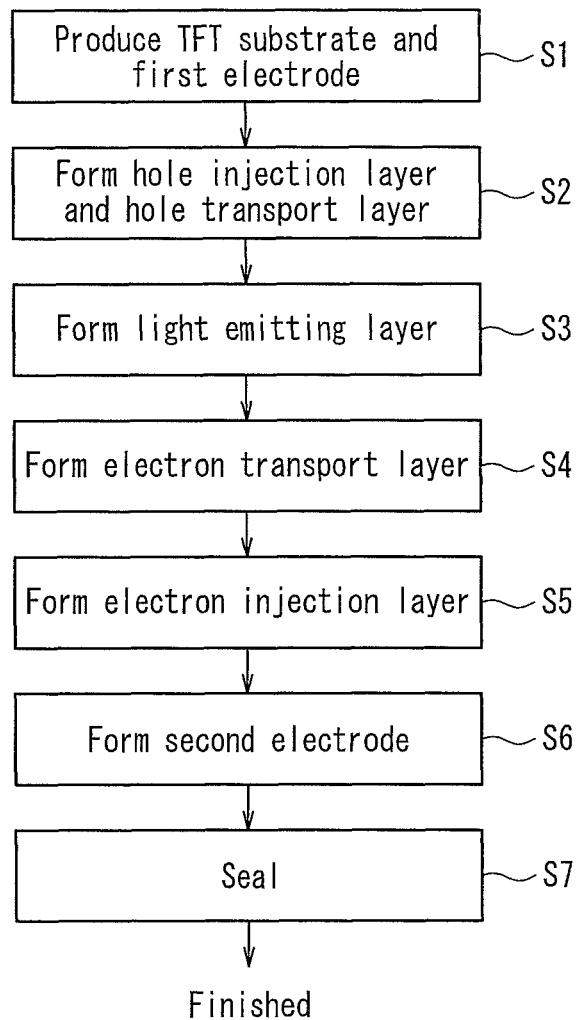
FIG. 4 is a flowchart illustrating the steps of a process for manufacturing an organic EL display device in order.

FIG. 4 is a flowchart illustrating the steps of a process for manufacturing the above-described organic EL display device 1 in order.

As shown in FIG. 4, the method for manufacturing an organic EL display device 1 according to the present embodiment includes, for example, a TFT substrate/first electrode producing step S1, a hole injection layer/hole transport layer forming step S2, a light emitting layer forming step S3, an electron transport layer forming step S4, an electron injection layer forming step S5, a second electrode forming step S6 and a sealing step S7 in this order.

Each step of FIG. 4 will be described below. It should be noted, however, that the dimensions, materials and shapes of the constituent elements described below are merely examples, and the present invention is not limited thereto. Also, in the present embodiment, the first electrode 21 is used as a positive electrode and the second electrode 26 is used as a negative electrode, but in the case where the first electrode 21 is used as a negative electrode and the second electrode 26 is used as a positive electrode, the order of the layers laminated in the organic EL layer is reversed from that discussed below. Likewise, the materials for constituting the first electrode 21 and the second electrode 26 are also reversed from those discussed below.

First, a TFT 12, wires 14 and the like are formed on an insulating substrate 11 by a known method. As the insulating substrate 11, for example, a transparent glass substrate, plastic substrate or the like can be used. As an example, a rectangular glass plate having a thickness of about 1 mm and longitudinal and transverse dimensions of 500×400 mm can be used as the insulating substrate 11.

Next, a photosensitive resin is applied onto the insulating substrate 11 so as to cover the TFT 12 and the wires 14, and patterning is performed using a photolithography technique to form an inter-layer film 13. As a material for the inter-layer film 13, for example, an insulating material such as acrylic resin or polyimide resin can be used. Generally, polyimide resin is not transparent but colored. For this reason, when manufacturing a bottom emission type organic EL display device 1 as shown FIG. 3, it is preferable to use a transparent resin such as acrylic resin for the inter-layer film 13. There is no particular limitation on the thickness of the inter-layer film 13 as long as irregularities in the upper surface of the TFT 12 can be eliminated. As an example, an inter-layer film 13 having a thickness of about 2 pm can be formed by using acrylic resin.

Next, contact holes 13a for electrically connecting the first electrode 21 to the inter-layer film 13 are formed.

Next, a first electrode 21 is formed on the inter-layer film 13. Specifically, a conductive film (electrode film) is formed on the inter-layer film 13. Next, a photoresist is applied onto the conductive film and patterning is performed by using a photolithography technique, after which the conductive film is etched using ferric chloride as an etching solution. After that, the photoresist is stripped off using a resist stripping solution, and the substrate is washed. A first electrode 21 in a matrix is thereby obtained on the inter-layer film 13.

Examples of conductive film-forming materials that can be used for the first electrode 21 include transparent conductive materials such as ITO (indium tin oxide), IZO (indium zinc oxide) and gallium-added zinc oxide (GZO); and metal materials such as gold (Au), nickel (Ni) and platinum (Pt).

As the method for laminating conductive films, it is possible to use a sputtering method, a vacuum vapor deposition method, a CVD (chemical vapor deposition) method, a plasma CVD method, a printing method or the like can be used.

As an example, a first electrode 21 having a thickness of about 100 nm can be formed by a sputtering method using ITO.

Next, an edge cover 15 having a predetermined pattern is formed. The edge cover 15 can be formed by, for example, patterning performed in the same manner as performed for the inter-layer film 13, using the same insulating materials as those listed for the edge cover 15. As an example, an edge cover 15 having a thickness of about 1 μm can be formed using acrylic resin.

Through the above processing, the TFT substrate 10 and the first electrode 21 are produced (Step S1).

Next, the TFT substrate 10 that has undergone step S1 is baked under reduced pressure for the purpose of dehydration and then subjected to an oxygen plasma treatment in order to wash the surface of the first electrode 21.

Next, on the TFT substrate 10, a hole injection layer and a hole transport layer (in the present embodiment, a hole injection and transport layer 22) is formed over the display region 19 in the TFT substrate 10 by a vapor deposition method (S2).

Specifically, an open mask having an opening corresponding to the entire display region 19 is closely fixed to the TFT substrate 10. Materials for forming a hole injection layer and a hole transport layer are deposited over the display region 19 in the TFT substrate 10 through the opening of the open mask while the TFT substrate 10 and the open mask are rotated together.

As noted above, the hole injection layer and the hole transport layer may be integrated into a single layer, or may be independent layers. Each layer has a thickness of, for example, 10 to 100 nm.

Examples of materials for the hole injection layer and the hole transport layer include benzine, styryl amine, triphenyl amine, porphyrin, triazole, imidazole, oxadiazole, polyarylalkane, phenylene diamine, arylamine, oxazole, anthracene, fluorenone, hydrazone, stilbene, triphenylene, azatriphenylene and derivatives thereof, heterocyclic or linear conjugated monomers, oligomers or polymers, such as polysilane-based compounds, vinylcarbazole-based compounds, thiophene-based compounds, aniline-based compounds and the like.

As an example, a hole injection and transport layer 22 having a thickness of 30 nm can be formed using 4,4'-bis[N-(1-naphthyl)-N-phenylamino]biphenyl (α-NPD).

Next, on the hole injection and transport layer 22, light emitting layers 23R, 23G and 23B are formed in stripes so as to cover openings 15R, 15G and 15B in the edge cover 15 (S3). The light emitting layers 23R, 23G and 23B are deposited such that respective colors, namely, red, green and blue are applied to corresponding predetermined regions (vapor deposition by color).

As materials for the light emitting layers 23R, 23G and 23B, materials having a high light-emission efficiency such as low-molecular fluorescent dyes or metal complexes can be used. Examples thereof include anthracene, naphthalene, indene, phenanthrene, pyrene, naphthacene, triphenylene, anthracene, perylene, picene, fluoranthene, acephenanthrylene, pentaphene, pentacene, coronene, butadiene, coumarin, acridine, stilbene and derivatives thereof, tris(8-quinolinolato)aluminum complex, bis(benzoquinolinato) beryllium complex, tri(dibenzoylmethyl)phenanthroline europium complex, ditolyl vinyl biphenyl and the like.

The light emitting layers 23R, 23G and 23B can have a thickness of, for example, 10 to 100 nm.

The vapor deposition method and the deposition device of the present invention can be used particularly suitably in vapor deposition by color for forming light emitting layers 23R, 23G and 23B. The method for forming light emitting layers 23R, 23G and 23B using the present invention will be described later in detail.

Next, an electron transport layer 24 is formed over the display region 19 in the TFT substrate 10 so as to cover the hole injection and transport layer 22 and the light emitting layers 23R, 23G and 23B by a vapor deposition method (S4). The electron transport layer 24 can be formed in the same manner as in the hole injection layer/hole transport layer forming step (S2) described above.

Next, an electron injection layer 25 is formed over the display region 19 in the TFT substrate 10 so as to cover the electron transport layer 24 by a vapor deposition method (S5). The electron injection layer 25 can be formed in the same manner as in the hole injection layer/hole transport layer forming step (S2) described above.

Examples of materials for the electron transport layer 24 and the electron injection layer 25 include quinoline, perylene, phenanthroline, bisstyryl, pyrazine, triazole, oxazole, oxadiazole, fluorenone, and derivatives and metal complexes thereof, LW (lithium fluoride) and the like.

As noted above, the electron transport layer 24 and the electron injection layer 25 may be formed as a single layer in which these layers are integrated together, or may be formed as independent layers. Each layer has a thickness of, for example, 1 to 100 nm. The total thickness of the electron transport layer 24 and the electron injection layer 25 is, for example, 20 to 200 nm.

As an example, an electron transport layer 24 having a thickness of 30 nm can be formed using Alq (tris(8-hydroxyquinoline)aluminum), and an electron injection layer 25 having a thickness of 1 nm can be formed using LiF (lithium fluoride).

Next, a second electrode 26 is formed over the display region 19 in the TFT substrate 10 so as to cover the electron injection layer 25 by a vapor deposition method (S6). The second electrode 26 can be formed in the same manner as in the hole injection layer/hole transport layer forming step (S2) described above. The material (electrode material) for the second electrode 26 is preferably a metal having a small work function, or the like. Examples of such electrode materials include magnesium alloy (MgAg and the like), aluminum alloy (AlLi, AlCa, AlMg and the like), metal calcium, and the like. The second electrode 26 has a thickness of, for example, 50 to 100 nm. As an example, a second electrode 26 having a thickness of 50 nm can be formed using aluminum.

On the second electrode 26, a protective film may be formed so as to cover the second electrode 26, in order to prevent oxygen and moisture from entering the organic EL element 20 from the outside. As the material for the protective film, an insulating or conductive material can be used. Examples thereof include silicon nitride and silicon oxide. The protective film has a thickness of, for example, 100 to 1000 nm.

Through the above processing, the organic EL element 20 including the first electrode 21, the organic EL layer 27 and the second electrode 26 can be formed on the TFT substrate 10.

Next, as shown in FIG. 1, the TFT substrate 10 having the organic EL element 20 formed thereon is bonded to a sealing substrate 40 by using an adhesive layer 30 so as to enclose the organic EL element 20. As the sealing substrate 40, for example, an insulating substrate, such as a glass substrate or a plastic substrate, having a thickness of 0.4 to 1.1 mm can be used.

In this manner, an organic EL display device 1 is obtained.

In the organic EL display device 1, when the TFT 12 is turned on by input of signals from the wires 14, holes are injected from the first electrode 21 into the organic EL layer 27. On the other hand, electrons are injected from the second electrode 26 into the organic EL layer 27. The holes and the electrons are recombined in the light emitting layers 23R, 23G and 23B and emit predetermined color light when deactivating energy. By controlling emitting brightness of each of the sub-pixels 2R, 2G and 2B, a predetermined image can be displayed on the display region 19.

Hereinafter, S3, which is the step of forming light emitting layers 23R, 23G and 23B by vapor deposition by color, will be described.

(New Vapor Deposition Method)

The present inventors investigated, as the method for forming light emitting layers 23R, 23G and 23B by vapor deposition by color, a new vapor deposition method (hereinafter referred to as the "new vapor deposition method") in which vapor deposition is performed while a substrate is moved with respect to a vapor deposition source and a vapor deposition mask, instead of the vapor deposition method as disclosed in Patent Documents 1 and 2 in which a mask having the same size as a substrate is fixed to the substrate at the time of vapor deposition.

Figure 5:
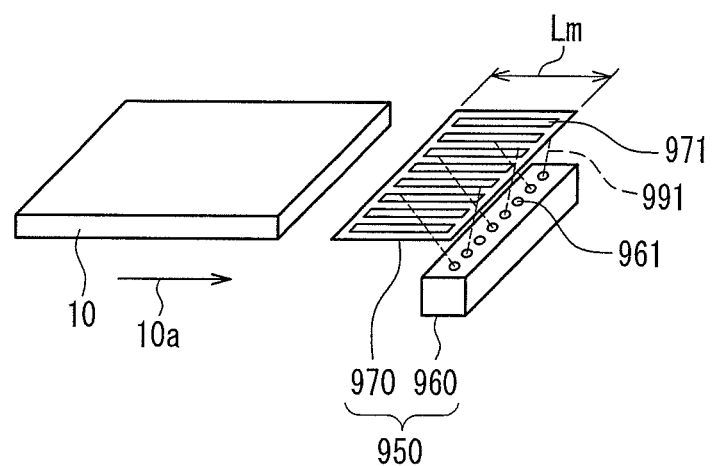
FIG. 5 is a perspective view showing the basic concept of a new vapor deposition method.

FIG. 5 is a perspective view showing the basic concept of the new vapor deposition method.

A vapor deposition source 960 and a vapor deposition mask 970 together constitute a vapor deposition unit 950. The relative position between the vapor deposition source 960 and the vapor deposition mask 970 is constant. A substrate 10 is moved at a constant speed in a direction indicated by 10a on the opposite side across the vapor deposition mask 970 from the vapor deposition source 960. A plurality of vapor deposition source openings 961 through which vapor deposition particles 991 are discharged are formed on the upper surface of the vapor deposition source 960. A plurality of mask openings 971 are formed in the vapor deposition mask 970. The vapor deposition particles 991 discharged from the vapor deposition source openings 961 pass through the mask openings 971 and adhere to the substrate 10. Vapor deposition is repeatedly performed for each color of light emitting layers 23R, 23G and 23B, whereby vapor deposition by color for forming light emitting layers 23R, 23G and 23B can be performed.

According to this new vapor deposition method, a dimension Lm of the vapor deposition mask 970 in the movement direction 10a of the substrate 10 can be set irrespective of a dimension of the substrate 10 in the same direction. This enables the use of a vapor deposition mask 970 that is smaller than the substrate 10. Accordingly, even if the substrate 10 is made large, the vapor deposition mask 970 does not need to be made large, and therefore the problem in that the vapor deposition mask 970 is bent by its own weight or being extended does not occur. Also, the vapor deposition mask 970 and a frame or the like for holding the vapor deposition mask 970 do not need to be made big and heavy. Accordingly, the problems encountered with the conventional vapor deposition methods disclosed in Patent Documents 1 and 2 are solved, and large-sized substrates can be subjected to vapor deposition by color.

However, the present inventors found, as a result of a further investigation, the new vapor deposition method shown in FIG. 5 is problematic in that a blur is more likely to occur at the edges of the formed coating film (vapor deposition film) as compared to the vapor deposition methods of Patent Documents 1 and 2. The cause of this problem will be described below.

Figure 6:
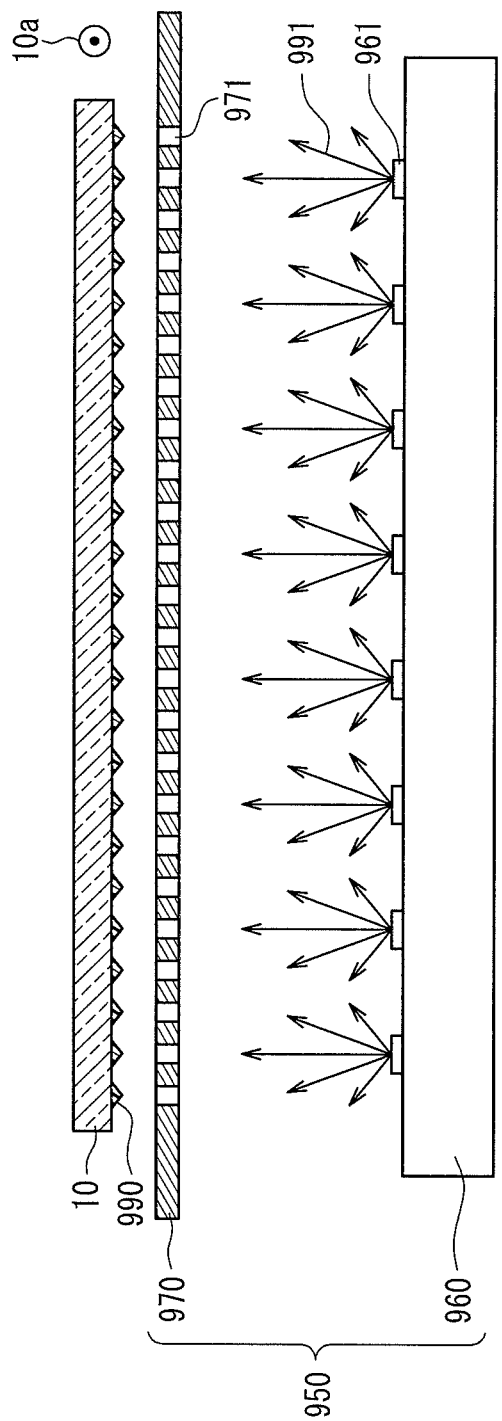
FIG. 6 is a front cross-sectional view of the vapor deposition device shown in FIG. 5 as viewed in a direction parallel to the movement direction of a substrate.

FIG. 6 is a cross-sectional view of the vapor deposition device shown in FIG. 5 as viewed in a plane perpendicular to the movement direction 10a of the substrate 10. A plurality of vapor deposition source openings 961 and a plurality of the mask opening 971 are arranged in the right-left direction of FIG. 6. The vapor deposition particles 991 from each vapor deposition source opening 961 are discharged over a certain range (directivity). Specifically, in FIG. 6, the number of vapor deposition particles 991 discharged from each vapor deposition source opening 961 is the greatest in a direction directly above the vapor deposition source opening 961 and gradually decreases as the angle (departure angle) formed with respect to the straight upward direction increases. The vapor deposition particles 991 discharged from the vapor deposition source openings 961 travel straight in their discharged direction. In FIG. 6, the flow of vapor deposition particles 991 discharged from the vapor deposition source openings 961 is conceptually indicated by arrows. Accordingly, each mask opening 971 mostly receives, but not necessarily limited thereto, the vapor deposition particles 991 discharged from the vapor deposition source opening 961 located directly below the mask opening 971 and also receives the vapor deposition particles 991 discharged from the vapor deposition source openings 961 located obliquely downward.

Figure 7:
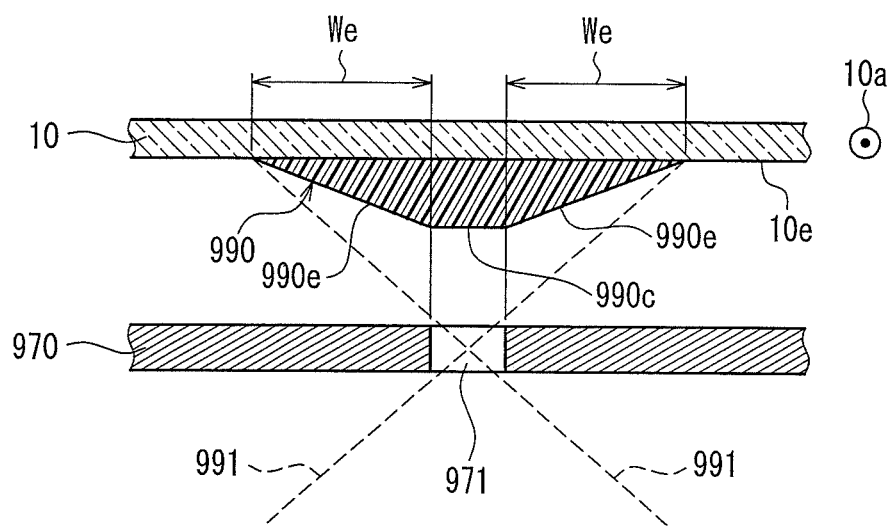
FIG. 7 is a cross-sectional view illustrating the cause of blur generated at the edges of a coating film in the new vapor deposition method shown in FIG. 5.

FIG. 7 is a cross-sectional view of a coating film 990 formed on a substrate 10 by vapor deposition particles 991 that have passed through a mask opening 971, as viewed in a plane perpendicular to the movement direction 10a of the substrate 10 as in FIG. 6. As described above, the vapor deposition particles 991 coming from various directions pass through the mask opening 971. The number of vapor deposition particles 991 that reach a deposition surface 10e of the substrate 10 is the greatest in a region directly above the mask opening 971 and gradually decreases as the position gets farther away therefrom. Accordingly, as shown in FIG. 7, on the deposition surface 10e of the substrate 10, a coating film main portion 990c having a sizable and substantially constant thickness is formed in the region where the mask opening 971 is projected onto the substrate 10 from directly above, and a blur portion 990e that is gradually thinner as the position gets farther away from the coating film main portion 990c is formed on both sides of the coating film main portion 990c.

If the blur portion 990e extends to the neighboring light emitting layer region having a different color due to an increase in the width We of the blur portion 990e, it causes "color mixing" or degradation of the characteristics of the organic EL element. Accordingly, it is necessary to prevent the blur portion 990e from extending to the neighboring light emitting layer region.

Figure 8:
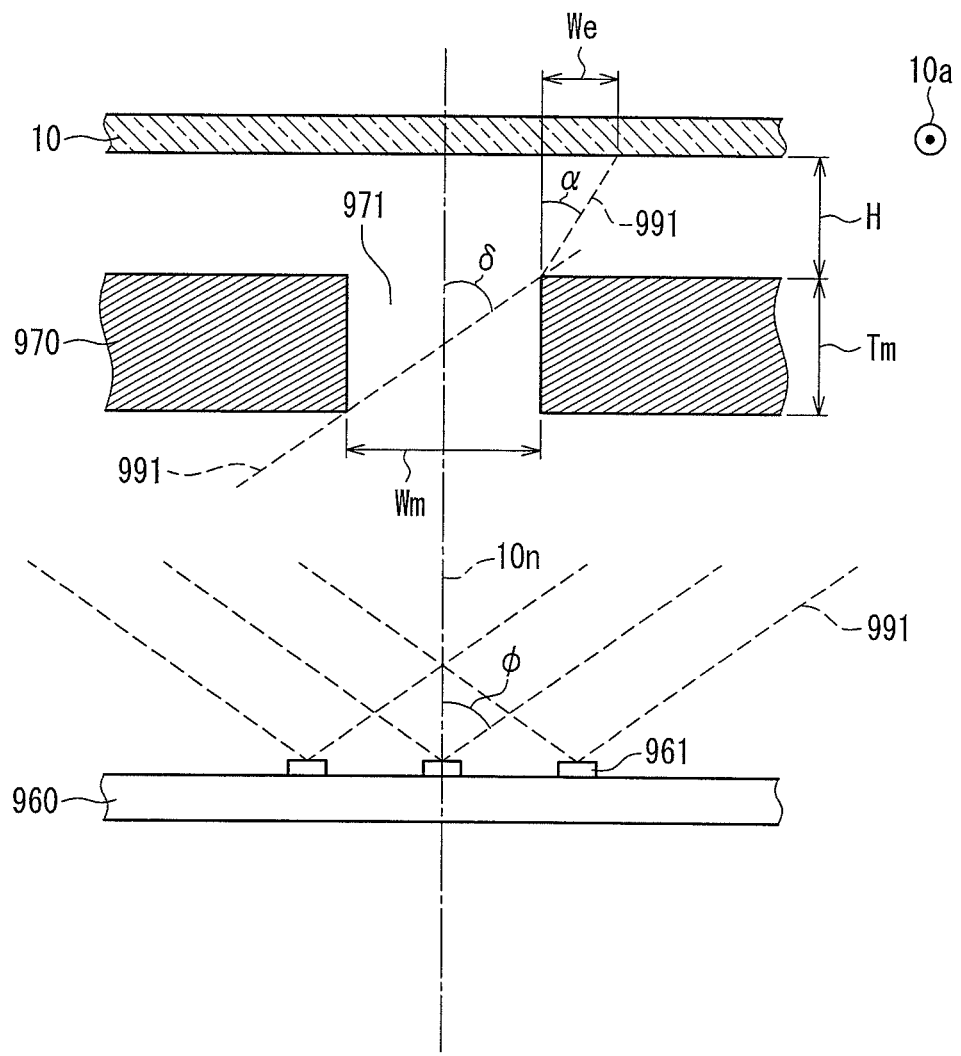
FIG. 8 is a cross-sectional view of the vapor deposition device shown in FIG. 5 as viewed in a direction parallel to the scanning direction of a substrate, showing the flight directions of vapor deposition particles.

As shown in FIG. 8, the greatest incidence angle of the vapor deposition particles 991 that have passed through the mask opening 971 with respect to the substrate 10 as viewed in a direction parallel to the movement direction 10a of the substrate 10 is represented by a (maximum incidence angle). Here, the incidence angle of the vapor deposition particles 991 is defined by the angle formed between the flight direction of the vapor deposition particles 991 and a normal line 10n of the substrate 10. The width We of the blur portion 990e shown in FIG. 7 is expressed by $$We = H \times \tan \alpha,$$

where the interval between the vapor deposition mask 970 and the substrate 10 is denoted by H.

Accordingly, in order to reduce the width We of the blur portion 990e, it is sufficient to reduce either one of the interval H between the vapor deposition mask 970 and the substrate 10 and the maximum incidence angle α of the vapor deposition particles 991 with respect to the substrate 10.

However, if the interval H between the vapor deposition mask 970 and the substrate 10 is reduced, the possibility increases that the vapor deposition mask 970 and the substrate 10 might collide with each other. In order to reduce the interval H without causing a collision between the substrate 10 and the vapor deposition mask 970 when the substrate 10 is moved with respect to the vapor deposition mask 970, it is necessary to control the position of the substrate 10 with respect to the vapor deposition mask 970, with high accuracy. Accordingly, there is a limit to the reduction of the interval H.

The maximum incidence angle α, on the other hand, is determined by the departure angle of the vapor deposition particles 991 discharged from the vapor deposition source opening 961 or the aspect ratio of the mask opening 971.

The departure angle of the vapor deposition particles 991 is defined by the angle formed between the flight direction of the vapor deposition particles 991 discharged from the vapor deposition source opening 961 and the normal line 10n of the substrate 10 as viewed in a direction parallel to the movement direction 10a of the substrate 10 as shown in FIG. 8. As described above, the vapor deposition particles 991 are discharged from the vapor deposition source opening 961 toward various directions. Generally, the amount of vapor deposition particles traveling directly above a vapor deposition source opening 961 (the vapor deposition particles having a departure angle of 0 degrees) is the greatest and gradually decreases as the departure angle increases. The departure angle of the vapor deposition particles 991 having the greatest value is represented by $\phi$ (maximum departure angle).

The aspect ratio of the mask opening 971, on the other hand, is defined by the ratio (Tm/Wm) of thickness Tm of the vapor deposition mask 970 to opening width Wm of the mask opening 971 when the mask opening 971 is viewed in a direction parallel to the movement direction 10a of the substrate 10 as shown in FIG. 8. The aspect ratio of the mask opening 971 can be represented by cotδ, where the greatest angle formed between the flight direction of the vapor deposition particles 991 that can pass through the mask opening 971 and the normal line 10n of the substrate 10 is denoted by δ.

If $\phi \geq \delta$ is satisfied, the maximum incidence angle α of the vapor deposition particles is dependent on the aspect ratio cotδ of the mask opening 971 (or in other words, α=δ). Accordingly, by increasing the aspect ratio cotδ, the maximum incidence angle α of the vapor deposition particles can be reduced.

However, the following problems arise if the aspect ratio cotδ of the mask opening 971 is increased.

The first problem is that due to the thickness Tm of the vapor deposition mask 970 being large, the vapor deposition particles easily adhere to the inner circumferential surface of the mask opening 971, as a result of which the substantial opening dimension becomes small, and in the worst case, the mask opening 971 is clogged. For example, in order to reduce the width We of the blur portion 990e to 50 μm or less when the interval H between the vapor deposition mask 970 and the substrate 10 is 0.5 mm, it is necessary to satisfy α=δ≈5.7°. Accordingly, cotδ≈10 is obtained. In the mask opening 971 whose inner circumferential surface is parallel to the normal line 10n of the substrate 10 as shown in FIG. 8, when the opening width Wm of the mask opening 971 is set to 90 μm, the thickness Tm of the vapor deposition mask 970 needs to be 900 μm in order to satisfy cotδ≈10. This requires the vapor deposition mask 970 to be made so as to be 9 to 90 times thicker than a commonly used vapor deposition mask having a thickness of 10 to 100 μm. The amount of vapor deposition particles that adhere to the inner circumferential surface of the mask opening 971 increases as the thickness Tm of the vapor deposition mask 970 is increased.

The second problem is that it becomes difficult to manufacture the vapor deposition mask 970 as the aspect ratio increases. Generally, a metal is used as the material for the vapor deposition mask 970, in consideration of heat resistance, workability and thermal expansion coefficient. As the method for forming the mask opening 971 whose inner circumferential surface is substantially orthogonal to the surface, an electroforming method, a boring method such as laser cutting, or the like is used. It is difficult to form an opening having a high aspect ratio in a metal board by using such a method, and technical difficulty is involved in achieving, for example, a highly accurate opening having an aspect ratio cotδ of 3 or greater. Accordingly, it is extremely difficult to form a large number of mask openings 971 in a metal plate having a thickness Tm of 900 μm as in the above example with high accuracy. Also, even if such a vapor deposition mask is successfully made, the cost for manufacturing the vapor deposition mask will be high, and thus the cost for an organic EL display device manufactured by using the vapor deposition mask will be high.

The third problem is that the increase in the aspect ratio increases the thickness of the vapor deposition mask 970 and eventually increases the weight of the vapor deposition mask 970, as a result of which conspicuous bending and deformation can occur in the vapor deposition mask 970 by its own weight. If the vapor deposition mask 970 is deformed by its own weight, the interval H between the vapor deposition mask 970 and the substrate 10 varies depending on the position on the surface of the vapor deposition mask 970, and thus the width We of the blur portion 990e cannot be constant in the surface of the substrate 10.

Accordingly, there is a limit to the increase of the aspect ratio cotδ of the mask opening 971. It can be seen that it is difficult to reduce the maximum incidence angle α of the vapor deposition particles by increasing the aspect ratio cotδ.

In contrast, if $\phi < \delta$ is satisfied, the maximum incidence angle α of the vapor deposition particles is dependent on the maximum departure angle $\phi$ of the vapor deposition particles (or in other words, α=$\phi$). Accordingly, by reducing the maximum departure angle $\phi$, the maximum incidence angle α of the vapor deposition particles can be reduced.

Generally, it is considered that the maximum departure angle $\phi$ can be adjusted by the shape of the vapor deposition source opening 961. It is, however, not easy to reduce the maximum departure angle $\phi$ as imagined.

Patent Document 3 states that by forming a vapor deposition source opening so as to have a tapered cross-sectional shape whose diameter increases toward the substrate, a vapor deposition film having a thickness distribution having a sharp peak can be formed at the position right in front of the vapor deposition source opening. However, as shown in FIG. 4 of Patent Document 3, in the case where the vapor deposition source opening having a tapered cross-sectional shape is used, the thickness distribution near the portion having the greatest vapor deposition film thickness does become sharp as compared to the case where a vapor deposition source opening having a constant diameter is used, but the vapor deposition film forming region (or in other words, the range where the vapor deposition particles adhere) is about the same. That is, even if the shape of the vapor deposition source opening is changed so as to have a tapered cross section described in Patent Document 3, the maximum departure angle $\phi$ shows little change.

Patent Document 4 states that a vapor deposition beam direction adjustment plate having vapor deposition beam-pass-through holes formed therein is disposed between a vapor deposition source and a vapor deposition mask. By causing the vapor deposition particles discharged from the vapor deposition source to pass through the vapor deposition beam-pass-through holes formed in the vapor deposition beam direction adjustment plate, the directivity of vapor deposition beam is increased. Patent Document 4 states that the vapor deposition beam-pass-through holes preferably have a diameter of about 0.1 mm to 1 mm, in order to sufficiently increase the directivity. However, the use of the vapor deposition beam direction adjustment plate having vapor deposition beam-pass-through holes of such a small diameter causes problems similar to those when the aspect ratio of the mask opening 971 is increased as described above. Specifically, due to having a small diameter, the vapor deposition beam-pass-through holes are likely to be clogged as a result of the vapor deposition particles adhering to the inner circumferential surface of the vapor deposition beam-pass-through holes. Also, it is technically difficult to form a large number of vapor deposition beam-pass-through holes having a small diameter with high accuracy, and it requires high cost. If the diameter of the vapor deposition beam-pass-through holes is increased in order to improve workability, the vapor deposition beam direction adjustment plate needs to be made thick in order to obtain the desired directivity of vapor deposition beam. As a result, the vapor deposition beam direction adjustment plate will be bent or deformed by its own weight, making the directivity and the width of blur portions nonuniform. Furthermore, there will be a large amount of vapor deposition particles that cannot pass through the vapor deposition beam-pass-through holes, decreasing the vapor deposition rate and the utilization efficiency of the vapor deposition material. If the vapor deposition beam direction adjustment plate is applied to the new vapor deposition method shown in FIG. 5, even in a direction that is parallel to the movement direction 10a of the substrate 10 and in which it is unnecessary to increase the directivity of vapor deposition beam, vapor deposition beam beams with low directivity will be captured, causing an undesirable decrease in the utilization efficiency of the vapor deposition material.

As described above, the new vapor deposition method shown in FIG. 5 is advantageous in that vapor deposition by color can be performed on a large-sized substrate, but it is difficult to reduce the width We of the blur portion 990e while preventing reduction of the utilization efficiency of the vapor deposition material at the same time. In order to prevent the blur portion 990e from extending to the neighboring light emitting layer region having a different color, so as to not cause color mixing, it is necessary to reduce the opening width of pixels (the pixels referring to the sub-pixels 2R, 2G and 2B shown in FIG. 2) or to increase the pixel pitch so as to increase the non-light-emitting region. However, if the opening width of the pixels is reduced, the light-emitting region will be small, causing a reduction in brightness. If the current density is increased in order to obtain the required brightness, the organic EL element will have a short service life and easily be damaged, causing a reduction in reliability. If, on the other hand, the pixel pitch is increased, display of high definition images cannot be achieved, reducing the quality of display.

(Second New Vapor Deposition Method)

As a method of vapor deposition by color that solves the above problems encountered with the new vapor depositon method shown in FIGS. 5 and 6, the present inventors investigated a vapor deposition method (hereinafter, referred to as the "second new vapor deposition method") in which a plurality of control plates are disposed between the vapor deposition source and the vapor deposition mask.

Figure 9:
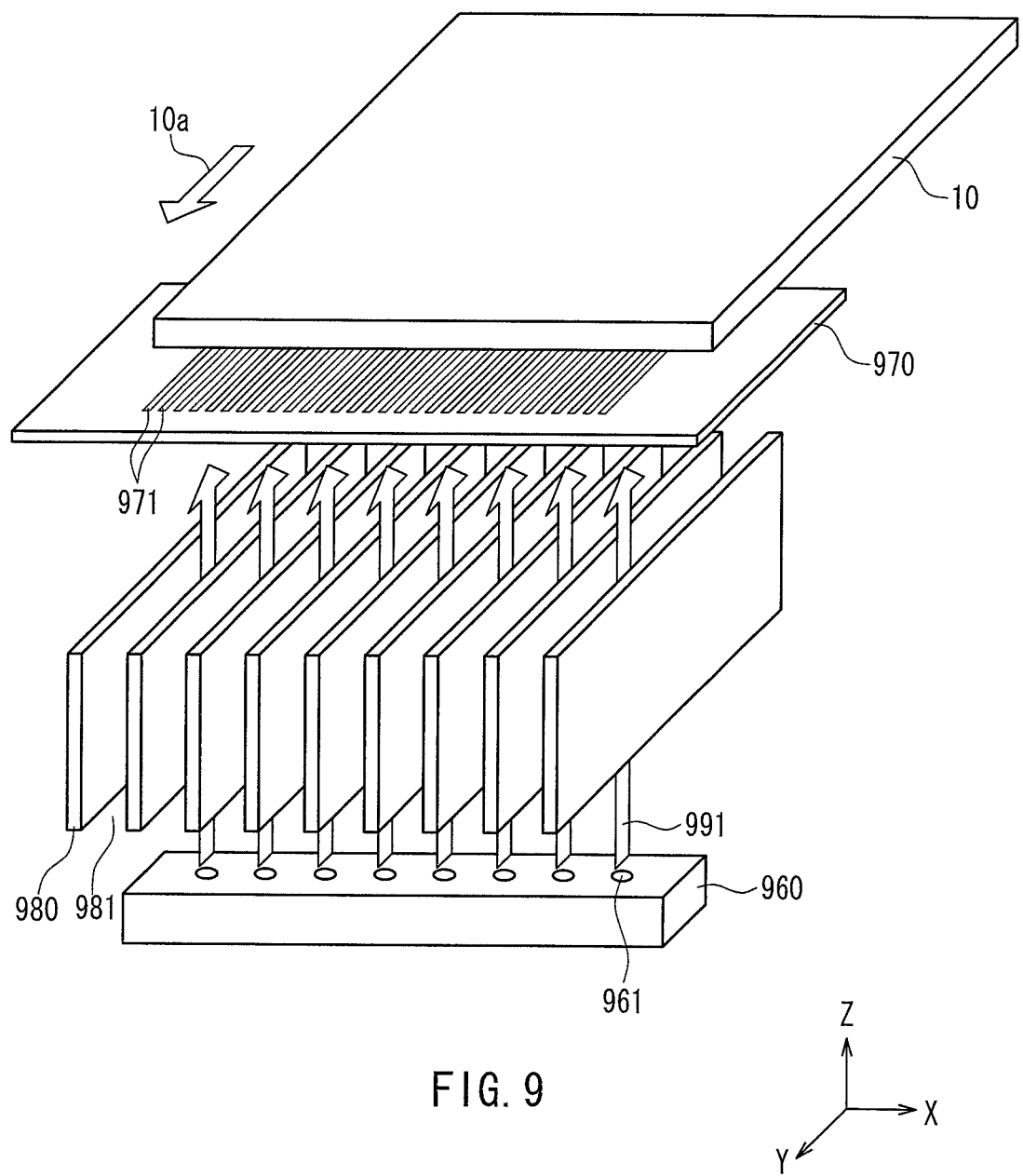
FIG. 9 is a perspective view showing the basic concept of a second new vapor deposition method.
Figure 10:
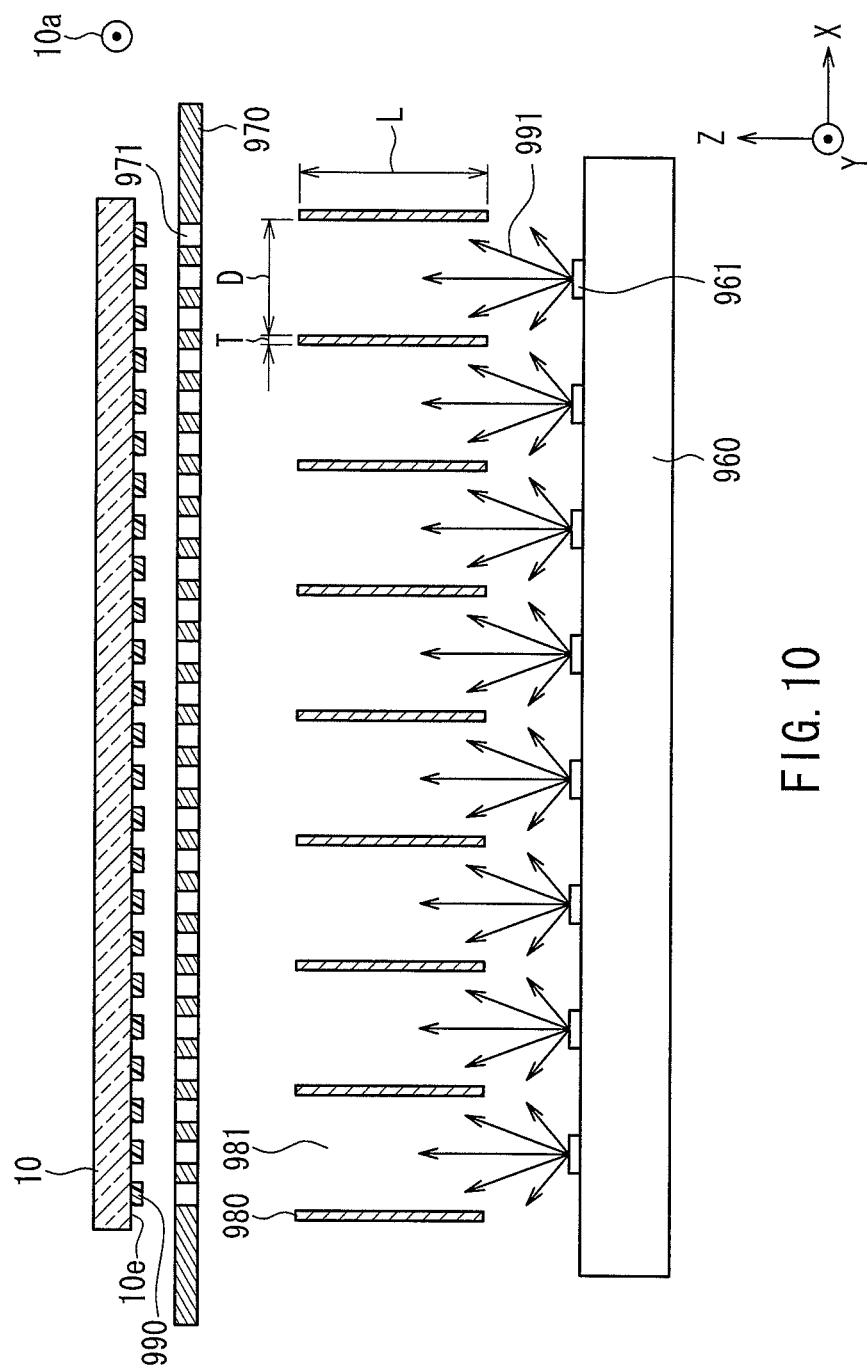
FIG. 10 is a front cross-sectional view of the vapor deposition device shown in FIG. 9 as viewed in a direction parallel to the traveling direction of a substrate.

FIG. 9 is a perspective view showing the basic concept of the second new vapor deposition method. FIG. 10 is a front cross-sectional view of the vapor deposition device shown in FIG. 9 as viewed in a direction parallel to the traveling direction of the substrate. In these diagrams, components that are the same as those shown in FIGS. 5 and 6 are given the same reference numerals, and thus a description thereof is not given here. For the sake of convenience of the description given below, an XYZ orthogonal coordinate system is set in which a horizontal axis extending along the width direction of the substrate 10 is defined as the X axis, a horizontal axis perpendicular to the X axis is defined as the Y axis, and an up-down direction axis perpendicular to the X axis and the Y axis is defined as the Z axis. The Y axis is parallel to the movement direction 10a of the substrate 10, and the Z axis is parallel to the normal line direction of the deposition surface 10e of the substrate 10.

A plurality of control plates 980 are disposed between the vapor deposition source 960 and the vapor deposition mask 970. The major surface (the suface having the largest area) of each control plate 980 is parallel to the YZ plane. The plurality of control plates 980 are disposed at a constant pitch in parallel to a direction in which a plurality of vapor deposition source openings 961 are arranged (specifically, the X axis direction).

The action of the control plates 980 will be described.

The vapor deposition particles 991 discharged from each vapor deposition source opening 961 over a certain range (directivity) enter a space (hereinafter referred to as the "control space 981") between neighboring control plates 980. Among the vapor deposition particles 991, those having a large speed vector component in the X axis direction collide with and adhere to the control plates 980 and therefore cannot reach the mask openings 971. That is, the control plates 980 limit the incidence angle of the vapor deposition particles 991 entering the mask openings 971. As used herein, "incidence angle" of the vapor deposition particles 991 with respect to a mask opening 971 is defined as the angle formed between the flight direction of the vapor deposition particles 991 and the Z axis on a projection onto the XZ plane.

As described above, with the second new vapor deposition method, the directivity of the vapor deposition particles 991 in the X axis direction can be improved by using the plurality of control plates 980. Accordingly, because the maximum incidence angle α (see FIG. 8) of the vapor deposition particles 991 with respect to the substrate 10 can be reduced, the width We of the blur portion 990e can be reduced.

On the other hand, the plurality of control plates 980 are also parallel to the YZ plane, and therefore even vapor deposition particles 991 having a large speed vector component in the Y axis direction are not captured by the control plates 980. Accordingly, with the second new vapor deposition method that uses a plurality of control plates 980, the reduction of the utilization efficiency of the vapor deposition material and the vapor deposition rate can be made significantly smaller than the case of using the vapor deposition beam direction adjustment plate described in Patent Document 4.

An example of a design condition for a plurality of control plates 980 required to limit the maximum incidence angle α (see FIG. 8) of the vapor deposition particles 991 with respect to the substrate 10 to 5.7° by using the plurality of control plates 980 is shown below. In the case where the interval D between neighboring control plates 980 in the X axis direction is 5 mm, and the dimension (thickness) T in the Z axis direction of the control plates 980 is 0.5 mm, by setting the length (dimension in the Z axis direction) L of the control plates 980 to 50 mm, α=5.7° is satisfied. The dimension in the Y axis direction of the control plates 980 can be set to, but not particularly limited to, for example, 200 mm. According to this design condition, it is necessary to dispose a plurality of control plates 980 at an interval of 5 mm interval, each control plate having a plate shape with dimensions of 50 mm×200 mm×0.5 mm. The control plates 980 can be easily made in a separate manner, and can be easily disposed at an interval of 5 mm. Therefore, the plurality of control plates 980 are also superior in workability to the vapor deposition beam direction adjustment plate of Patent Document 4 that requires formation of a plurality of vapor deposition beam-pass-through holes having a small diameter. Furthermore, the control plates 980 are also superior to the vapor deposition beam direction adjustment plate of Patent Document 4 in terms of weight reduction and ease of replacement.

With the second new vapor deposition method, in order to reduce the width We of the blur portion 990e by using a plurality of control plates 980, the aspect ratio (length L of control plate 980/interval D of control plate 980) of the control space 981 may be increased. In other words, the interval D in the X axis direction of the control plates 980 may be reduced, or the length L of the control plates 980 may be increased.

However, if the interval D in the X axis direction of the plurality of control plates 980 is reduced, the open area ratio of the plurality of control plates 980 decreases. Here, the open area ratio of the plurality of control plates 980 is defined by $D/(D+T)$ using the thickness T of the control plates 980 and the interval D in the X axis direction of the plurality of control plates 980. If the interval D is reduced, the open area ratio decreases sharply, which increases the amount of vapor deposition material that adheres to the control plates 980, resulting in a reduction in the utilization efficiency of the vapor deposition material.

If, on the other hand, the length L of the control plates 980 is increased, the weight of the control plates 980 increases, causing the control plates 980 to be easily deformed or displaced due to the weight of the control plates 980. Also, increasing the length L of the control plates 980 increases the thermal expansion of the control plates 980 due to increasing temperature. The maximum incidence angle α (see FIG. 8) thereby changes. As a result, a variation occurs in the width We of the blur portion 990e.

In order to prevent the control plates 980 from being deformed due to the weight of the control plates 980, the thickness T of the control plates 980 may be increased to improve rigidity. However, if the thickness T is increased, the open ratio of the plurality of control plates 980 decreases, resulting in a reduction in the utilization efficiency of the vapor deposition material.

Generally, with organic EL display devices, the pixel design varies from device to device, and thus the allowable width of the blur portion varies from device to device as well. With the second new vapor deposition method, if the allowable width of the blur portion is changed, it is necessary to change the aspect ratio of the control space 981 by replacing the control plates 980. Such a replacement operation of the control plates 980, however, causes problems such as a reduction in the processing cycle time and increased manufacturing cost.

As described above, the second new vapor deposition method shown in FIGS. 9 and 10 can reduce the width of the blur portion while preventing a reduction in the utilization efficiency of the vapor deposition material, as compared to the new vapor deposition method shown in FIGS. 5 and 6. However, further reduction of the width of the blur portion causes problems such as a variation in the width of the blur portion or a reduction in the utilization efficiency of the vapor deposition material. Also, changing the allowable width of the blur portion may require replacement of the control plates. In such a case, problems arise such as a reduction in the processing cycle time and an increased manufacturing cost.

The present inventors conducted an in-depth investigation to solve the above problems encountered with the second new vapor deposition method and the present invention has been accomplished. Hereinafter, preferred embodiments of the present invention will be described.

(Embodiment 1)

Figure 11:
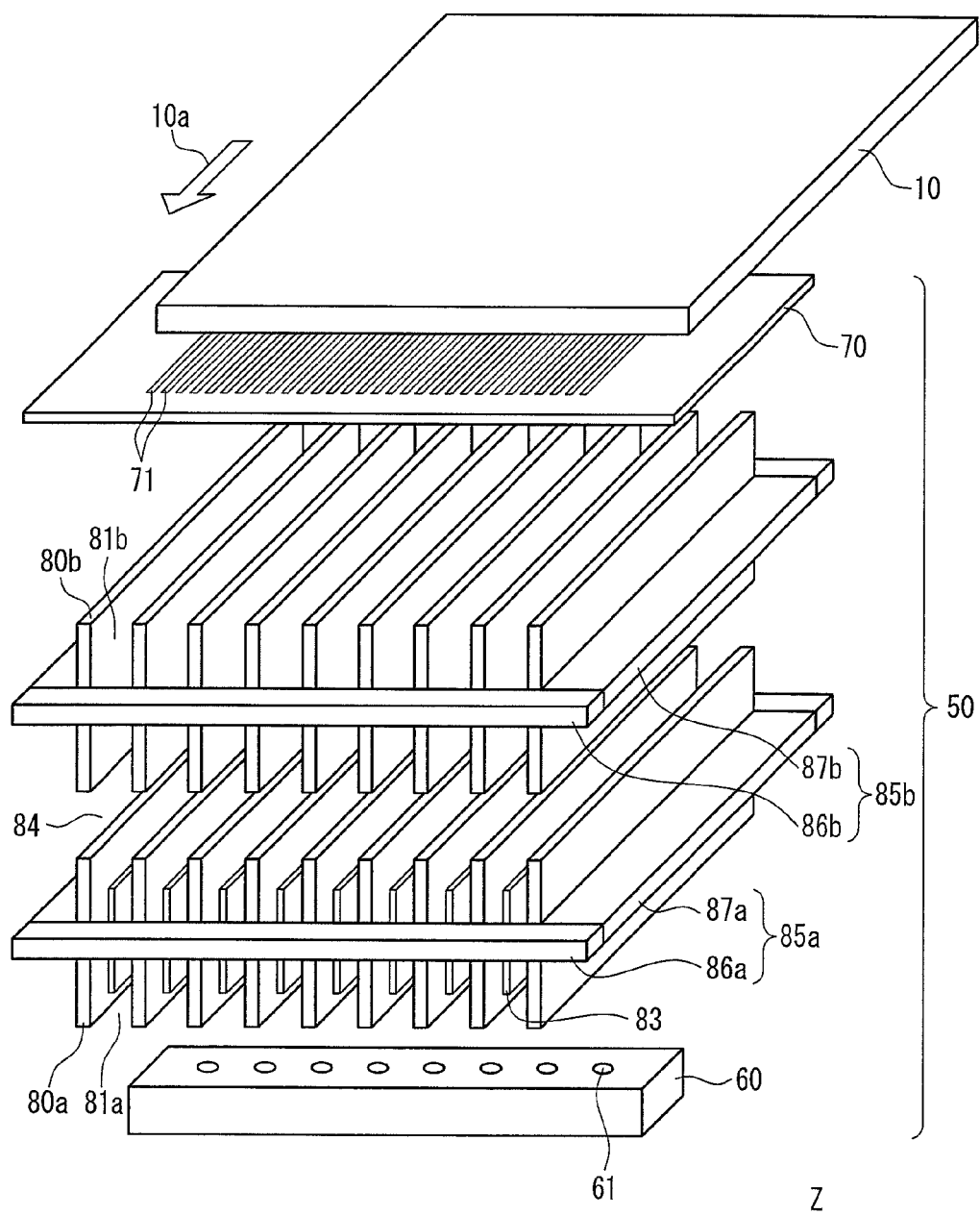
FIG. 11 is a perspective view showing principal parts of a vapor deposition device according to Embodiment 1 of the present invention.
Figure 12:
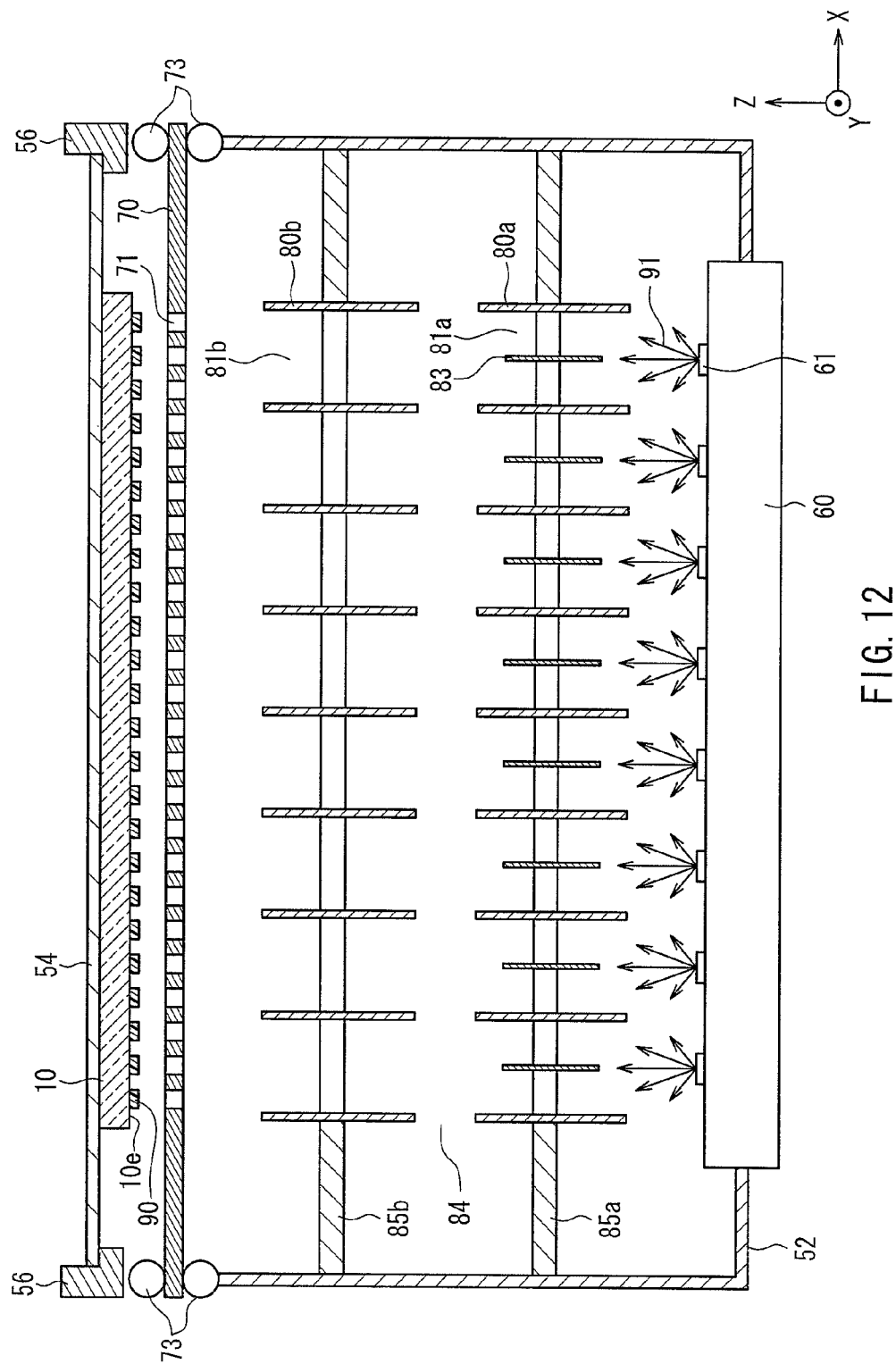
FIG. 12 is a front cross-sectional view of the vapor deposition device according to Embodiment 1 of the present invention as viewed in the scanning direction of a substrate.
Figure 13:
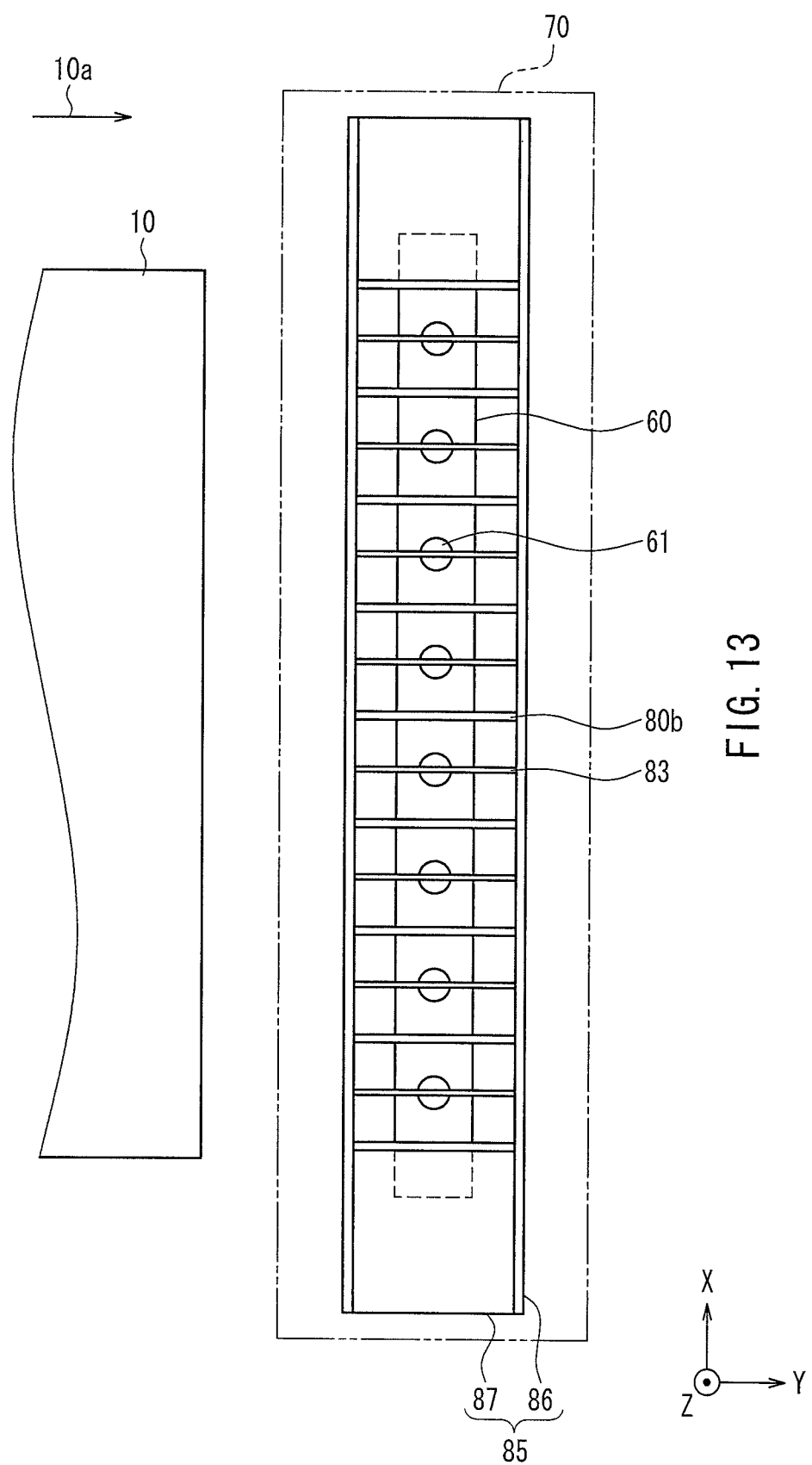
FIG. 13 is a plan view of the vapor deposition device according to Embodiment 1 of the present invention.

FIG. 11 is a perspective view showing principal parts of a vapor deposition device according to Embodiment 1 of the present invention. FIG. 12 is a front cross-sectional view of the vapor deposition device according to Embodiment 1 as viewed in a direction perpendicular to a width direction (first direction) of a substrate 10. FIG. 13 is a plan view of the vapor deposition device according to Embodiment 1 (illustration of a vapor deposition mask 70 is omitted). For the sake of convenience of the description given below, an XYZ orthogonal coordinate system is set in which a horizontal axis extending along the width direction of the substrate 10 is defined as the X axis, a horizontal axis perpendicular to the X axis is defined as the Y axis, and an up-down direction axis perpendicular to the X axis and the Y axis is defined as the Z axis. The Z axis is parallel to the normal line direction of the deposition surface 10e of the substrate 10. To facilitate the description, the side to which the arrow indicating the Z axis points (the upper side of FIG. 11) is referred to the "upper side".

A vapor deposition mask 70 is disposed so as to oppose a vapor deposition source 60 in the Z axis direction.

The vapor deposition source 60 has a plurality of vapor deposition source openings 61 in its upper surface (the surface facing the vapor deposition mask 70). The plurality of vapor deposition source openings 61 are arranged at a fixed pitch in the X axis direction (first direction). Each vapor deposition source opening 61 has a nozzle shape that is upwardly open parallel to the Z axis and discharges vapor deposition particles 91, which are a light emitting layer-forming material, toward the vapor deposition mask 70.

The vapor deposition mask 70 is a plate-shaped piece that has a major surface (the surface having the largest area) parallel to the XY plane and in which a plurality of mask openings 71 are formed along the X axis direction at different positions in the X axis direction. In the present embodiment, each mask opening 71 has an opening shape having a slot shape that is parallel to the Y axis, but the present invention is not limited thereto.

The vapor deposition mask 70 is held by a mask tension mechanism 73 (see FIG. 12). The mask tension mechanism 73 applies tension to the vapor deposition mask 70 in a direction parallel to the major surface, thereby preventing the occurrence of slack and stretch of the vapor deposition mask 70 due to its own weight.

Between a vapor deposition source opening 61 and the vapor deposition mask 70, a first control plate 80a and a second control plate 80b are disposed in this order in the Z axis direction (second direction) from the vapor deposition source opening 61 side toward the vapor deposition mask 70 side. There is a gap 84 between the first control plate 80a and the second control plate 80b that are opposed in the Z axis direction. In the present invention, a column composed of a plurality of control plates disposed along the Z axis (the first control plate 80a and the second control plate 80b in Embodiment 1) is referred to as a "control plate column". In the X axis direction, a plurality of control plate columns are disposed at a constant pitch.

A plurality of first control plates 80a that are disposed in the X axis direction are thin plates of the same size, and a plurality of second control plates 80b that are disposed in the X axis direction are also thin plates of the same size. The major surfaces (the surfaces having the largest area) of the first and second control plates 80a and 80b are perpendicular to the deposition surface 10e of the substrate 10 and parallel to the Y axis direction.

A plurality of correction plates 83 are disposed in the X axis direction such that the first control plates 80a and the correction plates 83 are alternately disposed in the X axis direction. The plurality of correction plates 83 are thin plates of the same size, and the major surfaces (the surfaces having the largest area) are perpendicular to the deposition surface 10e of the substrate 10 and parallel to the Y axis direction. In the X axis direction, each correction plate 83 is positioned at the center between two neighboring first control plates 80a in the X axis direction. Also, in the Z axis direction, the correction plates 83 are disposed on the vapor deposition source 60 side of the upper end of the gap 84 (specifically, the lower ends of the second control plates 80b) between the first control plates 80a and the second control plates 80b.

The plurality of first control plates 80a and the plurality of correction plates 83 are integrally held by a frame-shaped holding body 85a by means of, for example, welding or the like, the holding body 85a including a pair of first holding members 86a parallel to the X axis direction and a pair of second holding members 87a parallel to the Y axis direction (see FIG. 11). Likewise, the plurality of second control plates 80b are integrally held by a frame-shaped holding body 85b by means of, for example, welding or the like, the holding body 85b including a pair of first holding members 86b parallel to the X axis direction and a pair of second holding members 87b parallel to the Y axis direction. However, the method of holding the plurality of control plates 80a and 80b and the plurality of correction plates 83 is not limited to the above as long as the relative position and orientation of the plurality of control plates 80a and 80b and the plurality of correction plates 83 can be constantly maintained.

The vapor deposition source openings 61 and the plurality of first control plates 80a are spaced apart from each other in the Z axis direction, and the plurality of second control plates 80b and the vapor deposition mask 70 are spaced apart from each other in the Z axis direction. Also, the plurality of correction plates 83 and the vapor deposition source openings 61 are spaced apart from each other in the Z axis direction. The relative position of the vapor deposition source 60, the vapor deposition mask 70, the plurality of control plates 80a and 80b, and the plurality of correction plates 83 are constant at least during vapor deposition by color, and these together constitute a vapor deposition unit 50. For example, as shown in FIG. 12, by integrally holding the vapor deposition source 60, the mask tension mechanism 73, and the holding bodies 85a and 85b by using a holder 52, the relative position of the vapor deposition source 60, the vapor deposition mask 70, the plurality of control plates 80a and 80b, and the plurality of correction plates 83 can be constantly maintained.

As shown in FIG. 12, the substrate 10 is held by a holding device 54. As the holding device 54, for example, an electrostatic chuck that holds the surface of the substrate 10 opposite to the deposition surface 10e of the substrate 10 with electrostatic force can be used. The substrate 10 can thereby be held substantially without the substrate 10 being bent by its own weight. However, the holding device 54 for holding the substrate 10 is not limited to an electrostatic chuck and may be any other device.

The substrate 10 held by the holding device 54 is scanned (moved) in the Y axis direction (second direction) 10a at a constant speed by a moving mechanism 56 on the opposite side across the vapor deposition mask 70 from the vapor deposition source 60, with the substrate 10 being spaced apart from the vapor deposition mask 70 at a fixed interval. The movement of the substrate 10 may be a reciprocal movement or a single direction movement in which the substrate 10 is moved in either direction. There is no particular limitation on the configuration of the moving mechanism 56. For example, any known transfer driving mechanism can be used such as a linear motor or a feed screw mechanism that rotates a feed screw by a motor.

The vapor deposition unit 50, the substrate 10, the holding device 54 for holding the substrate 10 and the moving mechanism 56 for moving the substrate 10 are housed in a vacuum chamber (not shown). The vacuum chamber is a hermetically sealed container, with its internal space being vacuumed to a predetermined low pressure state and maintained.

The vapor deposition particles 91 discharged from a vapor deposition source opening 61 pass through a space (hereinafter referred to as a "first control space") 81a between neighboring first control plates 80a in the X axis direction, then through a space (hereinafter referred to as a "second control space") 81b between neighboring second control plates 80b in the X axis direction, and through a mask opening 71, and adhere to the deposition surface (specifically, the surface of the substrate 10 facing the vapor deposition mask 70) 10e of the substrate 10 to form a coating film 90. The coating film 90 has a stripe shape extending in the Y axis direction.

The vapor deposition particles 91 that form the coating film 90 necessarily pass through the first control space 81a, the second control space 81b and the mask openings 71. The control plates 80a and 80b and the vapor deposition mask 70 are designed so as to prevent a situation in which the vapor deposition particles 91 discharged from a vapor deposition source opening 61 reach the deposition surface 10e of the substrate 10 without passing through the control spaces 81a and 81b and the mask openings 71, and if necessary, a shielding plate (not shown) or the like that prevents flight of the vapor deposition particles 91 may be installed.

In the present embodiment, the correction plate 83 is disposed in each first control space 81a, and thus the vapor deposition particles 91 necessarily pass through the spaces between the first control plates 80a and correction plate 83 when passing through the first control space 81a.

By performing vapor deposition three times by changing the vapor deposition material 91 for each color, namely, red, green and blue (vapor deposition by color), stripe-shaped coating films 90 (specifically, light emitting layers 23R, 23G and 23B) that correspond to the respective colors of red, green and blue can be formed on the deposition surface 10e of the substrate 10.

As with the control plates 980 of the second new vapor deposition method shown in FIGS. 9 and 10, the control plates 80a and 80b limit the incidence angle of the vapor deposition particles 91 entering the mask openings 71 on a projection onto the XZ plane by causing the vapor deposition particles 91 having a large speed vector component in the X axis direction to collide with and adhere to the control plates 80a and 80b. As used herein, "incidence angle" of the vapor deposition particles 91 with respect to a mask opening 71 is defined as the angle formed between the flight direction of the vapor deposition particles 91 and the Z axis on a projection onto the XZ plane. As a result, the vapor deposition particles 91 that pass through a mask opening 71 at a large incidence angle are reduced. Accordingly, the width We of the blur portion 990e shown in FIG. 7 is reduced, and preferably the occurrence of blur portions 990e will substantially be prevented, and thus the occurrence of blur at both edges of the stripe-shaped coating film 90 can be suppressed significantly. As a result, in the organic EL display device, the need to increase the width of the non-light-emitting region between light-emitting regions so as to not cause color mixing is eliminated. Accordingly, it is possible to achieve display of high definition and high brightness images. In addition, the need to increase the current density in the light emitting layers in order to enhance brightness is also eliminated, a long service life can be achieved and reliability can be improved.

The control plates 80a and 80b constituting each control plate column of Embodiment 1 can be regarded as plates obtained by vertically dividing a control plate 980 according to the second new vapor deposition method shown in FIGS. 9 and 10 into two with a gap 84 therebetween. As shown in FIG. 14, by merely dividing the control plate 980 into two with a gap 84 therebetween, a situation may occur in which the vapor deposition particles 91 obliquely departing from a first control space 81a pass through the gap 84 and a second control space 81b other than the second control space 81b positioned directly above the first control space 81a, and enter a mask opening 71. The correction plate 83 captures such vapor deposition particles 91 that fly and pass through the gap 84. Accordingly, in Embodiment 1, despite the fact that the gap 84 is formed between the first control plates 80a and the second control plates 80b, only the vapor deposition particles 91 that have passed through a first control space 81a and the second control space 81b positioned directly above the first control space 81a in this order can pass through the mask openings 71. The first control plate 80a and the second control plate 80b that are arranged along the Z axis direction and constitute a control plate column have the same effect of limiting the incidence angle of the vapor deposition particles 91 entering the mask openings 71, as the continuous control plates without the gap 84. The first control plate 80a and the second control plate 80b constituting a control plate column can be regarded as a single continuous control plate having an effective length Le.

In order to reduce the width We of the blur portion 990e, with the second new vapor deposition method shown in FIGS. 9 and 10, as described above, it is necessary to reduce the interval D in the X axis direction of the plurality of control plates 980 or increase the length L of the control plates 980. Reducing the interval D results in a sharp reduction in the open area ratio of the plurality of control plates 980, causing a problem of reduction in the utilization efficiency of the vapor deposition material. On the other hand, increasing the length L of the control plates 980 results in an increase in the weight and thermal expansion of the control plates 980, causing a problem of the occurrence of variations in the width We of the blur portion.

In contrast, according to the present embodiment, a control plate column that can be regarded as a single continuous control plate having an effective length Le is constituted by a plurality of control plates. Each of the control plates constituting the control plate column has a relatively small length and is light weight. Accordingly, the effective length Le of the control plate column can be easily increased by increasing the length of each of the control plates within a range that does not cause a variation in the width We of the blur portion. If necessary, the effective length Le of the control plate column may be increased by increasing the number of control plates constituting the control plate column. Accordingly, with the present embodiment, it is possible to increase the length in the Z axis direction (specifically, effective length Le), without reducing the interval in the X axis direction between control plate columns. As a result, the width We of the blur portion 990e can be reduced without reducing the utilization efficiency of the vapor deposition material and without increasing variations in the width of the blur portion.

In the above embodiment, an example was shown in which each correction plate 83 was disposed within a single first control space 81a, but the first and second control plates 80a and 80b can be designed, without using the correction plates 83, so as to prevent a situation in which the vapor deposition particles 91 departing from a first control space 81a pass through the gap 84 and a second control space 81b other than the second control space 81b positioned directly above the first control space 81a, and enter the mask openings 71. In this case, the correction plates 83 can be omitted.

Example 1 corresponding to Embodiment 1 of the present invention will be described. However, needless to say, the present invention is not limited to the following example.

Figure 15:
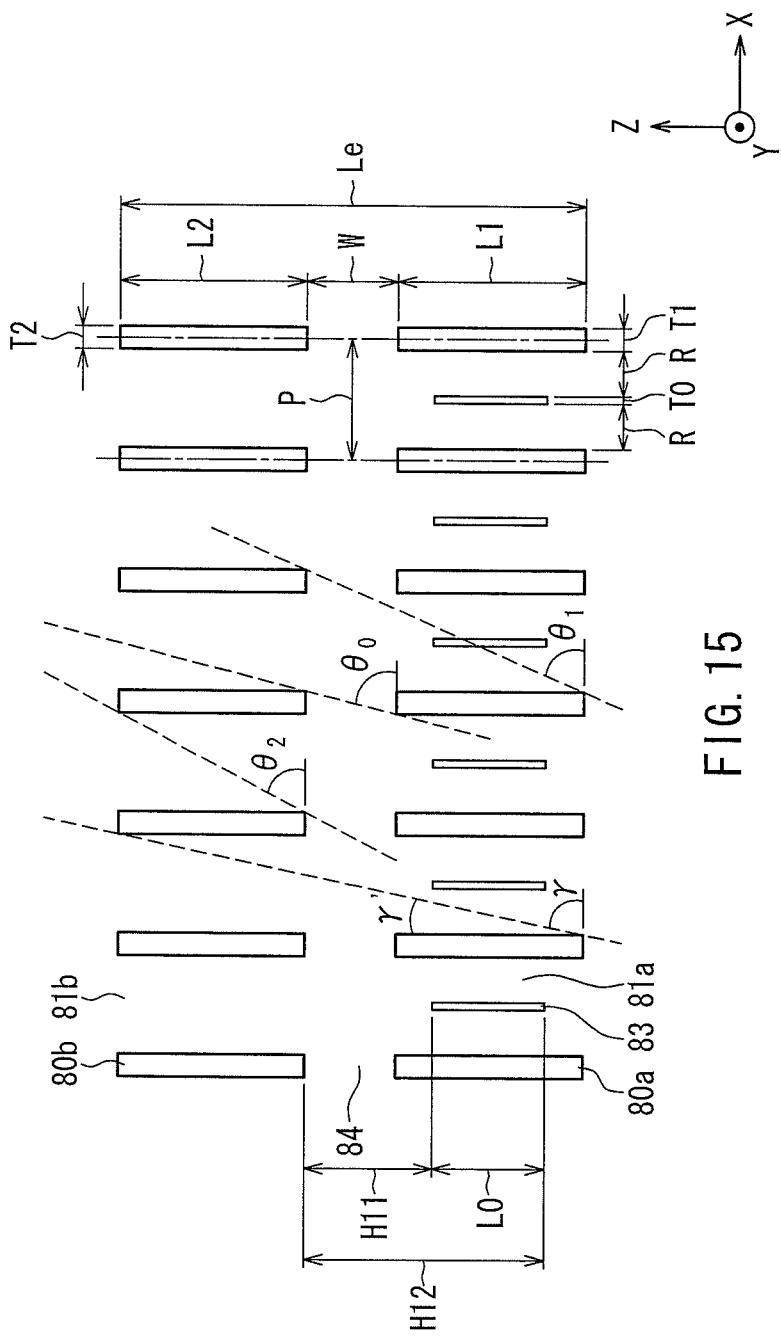
FIG. 15 is a partially enlarged front view showing a part of an arrangement of a first control plate, a second control plate, and the correction plate in Example 1 corresponding to Embodiment 1 according to the present invention.

FIG. 15 shows an enlarged view showing a part of control plates 80a and 80b and correction plates 83.

Each first control plate 80a had a length L1 in the Z axis direction of 70 mm, a length in the Y axis direction of 190 mm and a dimension (thickness) T1 in the X axis direction of 0.5 mm. Each second control plate 80b had a length L2 in the Z axis direction of 70 mm, a length in the Y axis direction of 190 mm and a dimension (thickness) T2 in the X axis direction of 0.5 mm. SUS 304 was used as a material of the first and second control plates 80a and 80b. A plurality of first control plates 80a and a plurality of second control plates 80b were integrally held by a holding member 85a and a holding member 85b (see FIGS. 11 and 12) respectively, with an arrangement pitch P in the X axis direction of 8 mm. The holding members 85a and 85b had an outer dimension in the Y axis direction of 200 mm and an outer dimension in the X axis direction of 600 mm.

The gap 84 between the first control plates 80a and the second control plates 80b that are opposed in the Z axis direction had a dimension W in the Z axis direction of 10 mm.

A correction plate 83 was disposed at the center between two neighboring first control plates 80a in the X axis direction. The correction plate 83 had a length L0 in the Z axis direction of 45 mm, a length in the Y axis direction of 190 mm, and a dimension (thickness) T0 in the X axis direction of 0.2 mm. The correction plate 83 was disposed such that, in the Z axis direction, a distance H11 in the Z axis direction between the upper end of the gap 84 (specifically, the lower end of the second control plates 80b) and the upper end of the correction plate 83 was 40 mm, and a distance H12 in the Z axis direction between the upper end of the gap 84 and the lower end of the correction plate 83 was 85 mm. As a material of the correction plate 83, the same material for the first and second control plates 80a and 80b, namely, SUS 304 was used. A plurality of correction plates 83 were integrally held by a holding member 85a holding the plurality of first control plates 80a (see FIGS. 11 and 12).

In Example 1, a single correction plate 83 was provided in each first control space 81a, and thus a situation did not occur in which the vapor deposition particles 91 departing from a first control space 81a passed through the gap 84 and a second control space 81b other than the second control space 81b positioned directly above the first control space 81a, and enter the mask openings 71. That is, the first control plate 80a and the second control plate 80b arranged in the Z axis direction with the gap 84 therebetween are equivalent to a single control plate that is continuous in the Z axis direction without a gap 84 therebetween, and the effective length Le (Le=L1+W+L2) was 150 mm.

As shown in FIG. 15, as viewed in the Y axis direction, if it is assumed that the angle formed between the X axis direction and a straight line connecting the lower end of a first control plate 80a and the upper end of the second control plate 80b positioned directly above a neighboring first control plate 80a that is adjacent to the first control plate 80a is denoted by γ, tan γ=20, and thus γ=87.1° is obtained. Accordingly, the spread angle γ' (γ'=90°−γ) of the vapor deposition particles determined by the control plates 80a and 80b was 2.9°. That is, the departure angle of the vapor deposition particles departing from the second control space 81b is limited to 2.9° or less by the first and second control plates 80a and 80b.

The opening shape of the vapor deposition source openings 61 as viewed from above along the Z axis direction was a circular shape. The interval in the Z axis direction between the upper end of a vapor deposition source opening 61 and the lower end of a first control plate 80a was 75 mm. The maximum departure angle φ (see FIG. 8) of the vapor deposition particles discharged from the vapor deposition source opening 61 was approximately 60°. Because γ'≤φ is satisfied, in this example, the greatest incidence angle (maximum incidence angle) of the vapor deposition particles that enter each mask opening 71 of the vapor deposition mask 70 is dependent on the spread angle γ', and was 2.9°. As used herein, "maximum incidence angle" of the vapor deposition particles that enter each mask opening 71 is defined as the angle formed between the flight direction of the vapor deposition particles that enter the mask opening 71 and the normal line (specifically, the Z axis direction) of the vapor deposition mask 70, as viewed in a direction parallel to the Y axis direction.

The vapor deposition mask 70 had a dimension in the X axis direction of 600 mm, a dimension in the Y axis direction of 200 mm and a dimension in the Z axis direction (thickness Tm) of 50 μm. An invar material (an alloy containing Fe and 36% of Ni) was used as a material for the vapor deposition mask 70.

The vapor deposition mask 70 had 751 mask openings 71 that were formed in the X axis direction at a pitch in the X axis direction of 450 μm, each mask opening 71 having a slot shape and a dimension in the Y axis direction of 150 mm and a dimension Wm in the X axis direction of 90 μm. At this time, the aspect ratio cots of a mask opening 971 (see FIG. 8) was 1.7. In this example, δ>γ' is satisfied, and thus the maximum incidence angle α of the vapor deposition particles with respect to the substrate 10 was dependent on the spread angle γ'.

Around the region of the vapor deposition mask 70 in which a plurality of mask openings 71 were formed, a shielding plate made of invar material was installed so as to prevent the vapor deposition particles from adhering to the deposition surface 10e of the substrate 10, without passing through the control spaces 81a and 81b and the mask openings 71.

The distance between the upper end of the second control plates 80b and the vapor deposition mask 70 was set to 120 mm, and the interval H between the vapor deposition mask 70 and the deposition surface 10e of the substrate 10 was set to 500 μm.

Pixels (the pixels referring to the sub-pixels 2R, 2G and 2B shown in FIG. 2) were each configured to have a size (the actual size of the light-emitting region) of 300 μm in the Y axis direction and 70 μm in the X axis direction. The pixel pitch in the Y axis direction was set to 450 μm and the pixel pitch in the X axis direction was set to 150 μm.

The vapor deposition rates of host material and guest material (dopant material) were set to 5.0 nm/s and 0.53 nm/s for red (R), 5.0 nm/s and 0.67 nm/s for green (G), and 5.0 nm/s and 0.67 nm/s for blue (B).

With the configuration as described above, the substrate 10 was subjected to a single round trip scanning in the Y axis direction so as to form a vapor deposition film that was made of an organic material and had the desired pixel pattern, whereby a light emitting layer was formed. That is, among the vapor deposition particles discharged from each vapor deposition source opening 61, only those that have passed through a first control space 81a, then a second control space 81b located directly above the first control space 81a, and then the mask openings 71 adhered to the deposition surface 10e of the substrate 10.

In Example 1, the maximum incidence angle α of the vapor deposition particles with respect to the substrate 10 was 2.9°, which was the same as the spread angle γ' of the vapor deposition particles departed from the second control space 81b. Accordingly, the width We (see FIG. 7) of the blur portion of the coating film was as follows:

$$We = H \times \tan \alpha = 25 \text{ μm}.$$

The width We of the blur portion was smaller than the dimension in the X axis direction of a non-light-emitting region between neighboring light-emitting regions that were adjacent in the X axis direction. In addition, the lengths L1 and L2 of the first and second control plates 80a and 80b were as short as 70 mm, and thus there were almost no variations in the width We of the blur portion. Accordingly, the blur portion was successfully brought within the non-light-emitting region. That is, the vapor deposition particles did not adhere in the light-emitting region of a different color that was adjacent in the X axis direction, and thus it was possible to manufacture a high-quality organic EL display device without color mixing. Also, due to the width We of the blur portion and its variations being small, it was possible to reduce the dimension in the X axis direction of the non-light-emitting region so that the light-emitting region of the pixel was increased. Accordingly, the current density was reduced and degradation of the light emitting layer constituting the organic EL element was prevented, as a result of which luminescence lifetime characteristics of the pixels were improved, and a highly reliable organic EL display device was obtained.

Example 1 given above is merely exemplary and can be changed as appropriate.

For example, the dimensions and arrangement of the correction plate 83 are not limited to the above example. However, it is necessary to design the correction plate 83 according to the design of the first and second control plates 80a and 80b, so as to avoid a situation in which the vapor deposition particles 91 departed from a first control space 81a pass through the gap 84 and then a second control space 81b other than the second control space 81b positioned directly above the first control space 81a and enter the mask openings 71. Specifically, the control plate 83 must satisfy the following conditions.

In FIG. 15, angles θ0, θ1 and θ2 are defined by Equation 1-1 given below.

$$\tan \theta 0 = 2 \times W/(T1/T2)$$

$$\tan \theta 1 = 2 \times (W+L1)/(2 \times P - T1 + T2)$$

$$\tan \theta 2 = L2/(P-T2) \quad \text{(Equation 1-1)}$$

The greater one of the angles θ1 and θ2 is represented by angle ξ. Also, as shown in FIG. 15, the interval in the X axis direction between the first control plate 80a and the correction plate 83 is represented by R. The length in the Z axis direction of the correction plate 83 is represented by L0, the distance in the Z axis direction between the upper end of the gap 84 (specifically, the lower end of the second control plate 80b) and the upper end of the correction plate 83 is represented by H11, and the distance in the Z axis direction between the upper end of the gap 84 and the lower end of the correction plate 83 is represented by H12.

If $\xi \geq \theta 0$, (a)

L0=0 (in other words, the correction plate 83 is unnecessary)

If $\xi < \theta 0$, (b)

$H12 \geq W + R \times \tan \theta 0$ $H11 \leq (R+T2) \times \tan \xi$ $L0 = H12 - H11 \geq W + R \times \tan \theta 0 - (R+T2) \times \tan \xi$ Depending on the design of the first and second control plates 80a and 80b, as shown in (a) above, the correction plate 83 can be omitted. In other words, if (a) above is satisfied, the vapor deposition particles 91 do not pass through the gap 84 even without the correction plate 83, and thus the effects of Embodiment 1 described above can be obtained.

In the above description, an example was shown in which two control plates 80a and 80b were disposed along the Z axis direction with a gap 84 therebetween, but the number of control plates disposed along the Z axis direction is not limited to two, and may be three or more. Regardless of the number of control plates, a correction plate needs to be installed if necessary so as to prevent the vapor deposition particles having passed through the gap 84 between two control plates that are opposed in the Z axis direction from adhering to the substrate 10. In this case, there is no particular limitation on the method for designing the correction plate, but as examples, two methods will be described below.

As a first method, a correction plate can be designed by applying Equation 1-1 above to gaps at different positions in the Z axis direction. Specifically, the first control plate and the second control plate according to Equation 1-1 are replaced with the nth control plate that is located at the nth position in the Z axis direction from the vapor deposition source 60 side and the (n+1)th control plate that is located at the (n+1)th position, and the nth correction plate with respect to the nth gap between the nth control plate and the (n+1)th control plate is designed by applying Equation 1-1 given above, where n is a positive integer. This processing is performed on all of the gaps.

Figure 16:
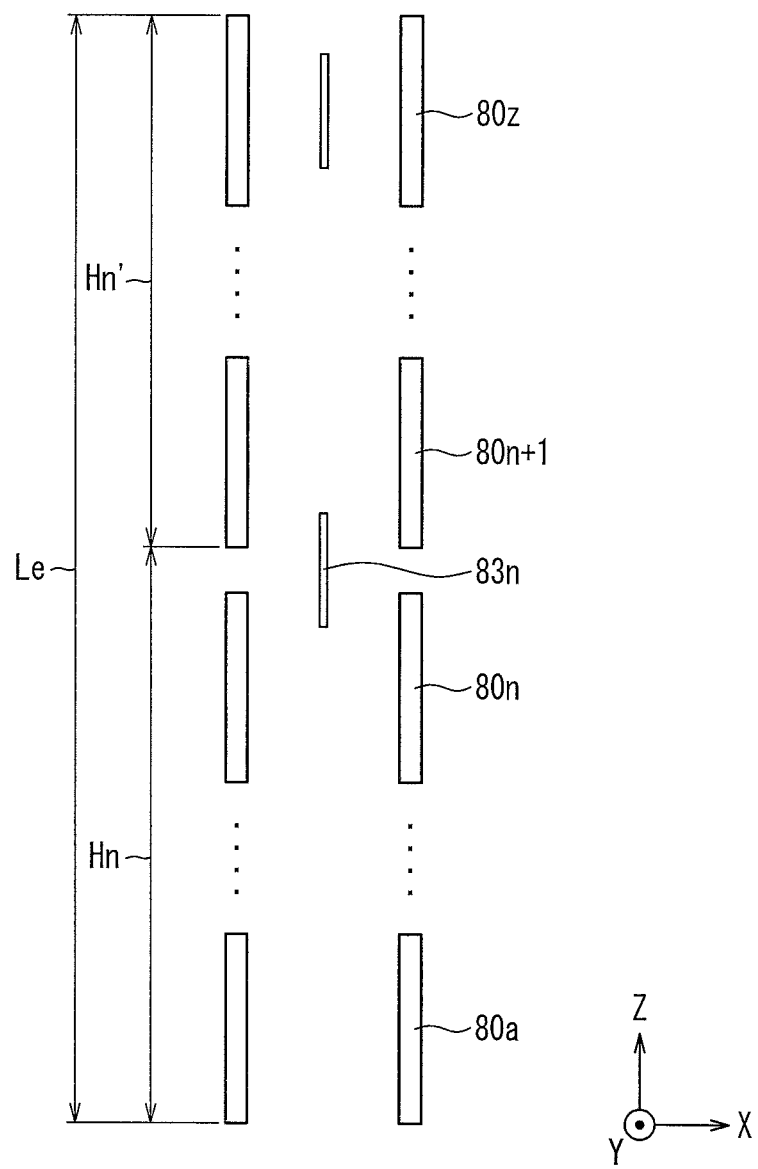
FIG. 16 is a diagram for illustrating a method for designing the correction plate, in the case where z control plates are disposed along the Z axis direction in Embodiment 1 according to the present invention.

The second method is as follows. As shown in FIG. 16, a case is considered in which a control plate column is constituted by z control plates disposed along the Z axis direction. The definitional equations of the angles $\theta 1$ and $\theta 2$ in Equation 1-1 are replaced as follows, where the distance in the Z axis direction between the lower end of the first control plate 80a at a position closest to the vapor deposition source and the lower end of the (n+1)th control plate $80_{n+1}$ is represented by Hn, and the distance in the Z axis direction between the lower end of the (n+1)th control plate $80_{n+1}$ and the upper end of the zth control plate 80z at a position closest to the vapor deposition mask is represented by Hn'.

$\tan \theta 1 = 2 \times Hn / (2 \times P - T1 + T_{n+1})$ $\tan \theta 2 = 2 \times Hn' / (2 \times P - T_{n+1} - T_z)$ (Equation 1-2)

Here, $T_{n+1}$ and $T_z$ respectively represent the thickness of the (n+1)th control plate $80_{n+1}$ and the thickness of the zth control plate 80z. Other than that, the nth correction plate 83n with respect to the nth gap between the nth control plate 80n and the (n+1)th control plate $80_{n+1}$ is designed by replacing the first control plate and the second control plate according to Equation 1-1 given above with the nth control plate 80n and the (n+1)th control plate $80_{n+1}$, and applying (a) or (b) above. According to this second method, the angles $\theta 1$ and $\theta 2$ can be increased, and thus design benefits can be obtained such as allowing the use of a single common control plate with respect to a plurality of gaps at different positions in the Z axis direction, or allowing the omission of a correction plate with respect to a certain gap.

(Embodiment 2)

In Embodiment 1, the correction plate 83 is disposed, in the Z axis direction, on the vapor deposition source 60 side of the upper end of the gap 84 (specifically, the lower end of the second control plate 80b) between the first control plate 80a and the second control plate 80b. In contrast, in Embodiment 2, the correction plate 83 is disposed, in the Z axis direction, on the vapor deposition mask 70 side of the lower end of the gap 84 (specifically, the upper end of the first control plate 80a) between the first control plate 80a and the second control plate 80b. The constituent elements of a vapor deposition device according to Embodiment 2 are the same as those of Embodiment 1, except for the above configuration.

Figure 17:
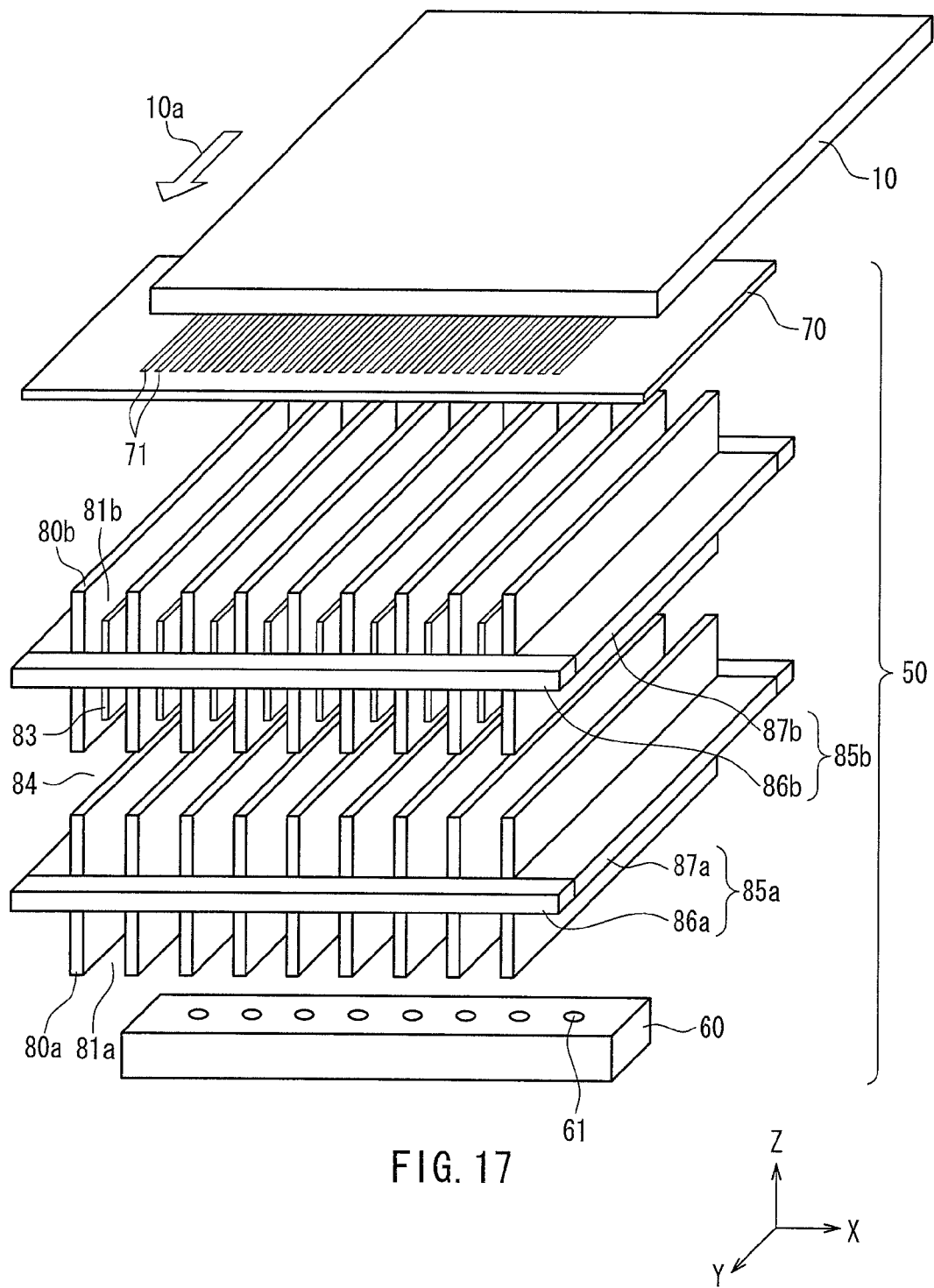
FIG. 17 is a perspective view showing principal parts of a vapor deposition device according to Embodiment 2 of the present invention.
Figure 18:
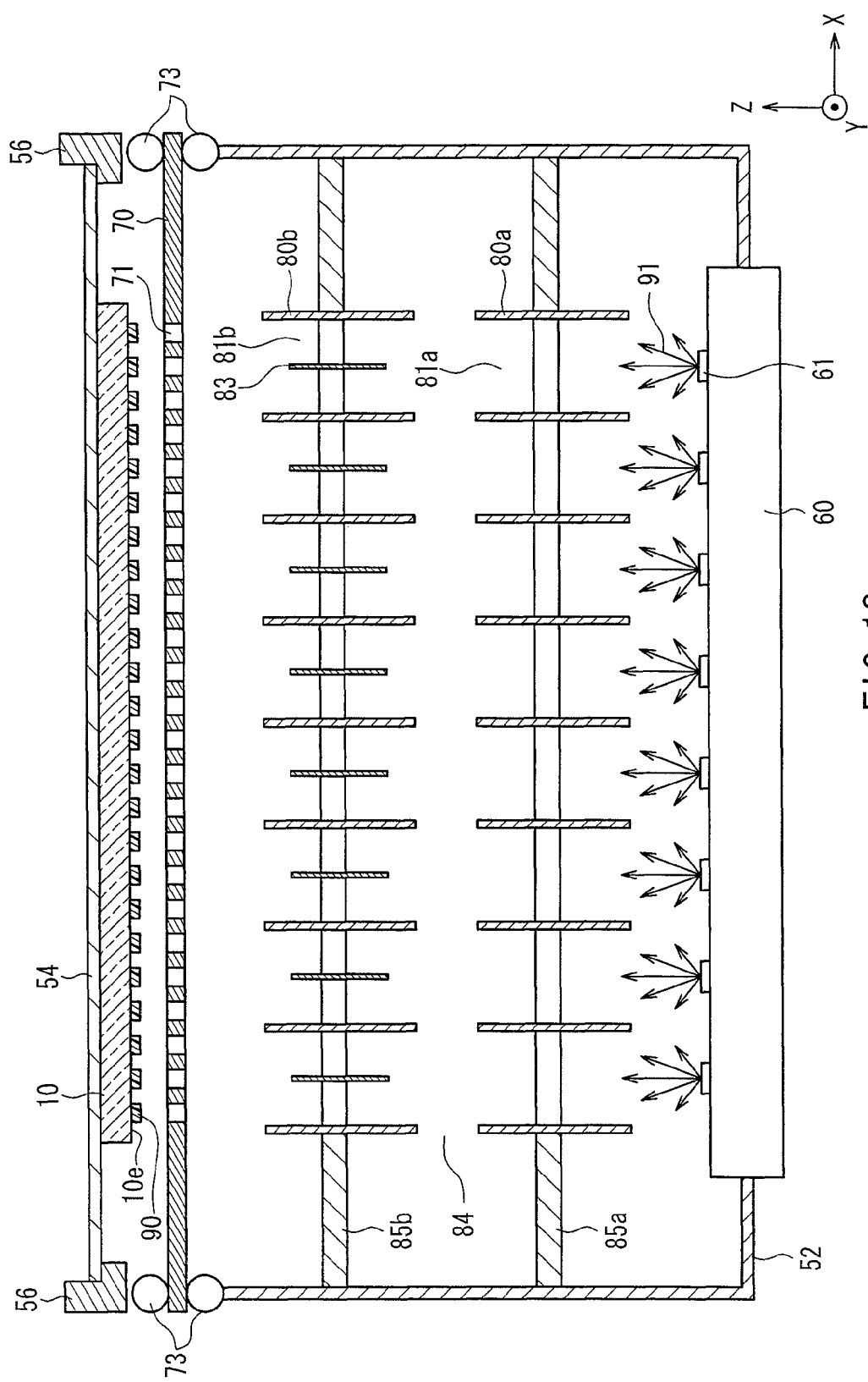
FIG. 18 is a front cross-sectional view of a vapor deposition device according to Embodiment 2 of the present invention as viewed in the scanning direction of a substrate.

FIG. 17 is a perspective view showing principal parts of the vapor deposition device according to Embodiment 2 of the present invention. FIG. 18 is a front cross-sectional view of the vapor deposition device according to Embodiment 2 as viewed in a direction perpendicular to the width direction of a substrate 10. In these diagrams, components that are the same as those shown in FIGS. 11 and 12 illustrating Embodiment 1 are given the same reference numerals, and thus a description thereof is not given here. Hereinafter, Embodiment 2 will be described, focusing on the difference from Embodiment 1.

A plurality of correction plates 83 are disposed in the X axis direction such that the second control plates 80b and the correction plates 83 are alternately disposed in the X axis direction. The plurality of correction plates 83 are thin plates of the same size, and the major surfaces (the surfaces having the largest area) are perpendicular to the deposition surface 10e of the substrate 10 and parallel to the Y axis direction. In the X axis direction, each correction plate 83 is positioned at the center between two neighboring second control plates 80b in the X axis direction.

The plurality of correction plates 83 are, together with the plurality of second control plates 80b, integrally held by a frame-shaped holding body 85b by means of, for example, welding or the like, the holding body 85b including a pair of first holding members 86b parallel to the X axis direction and a pair of second holding members 87b parallel to the Y axis direction. However, the method of holding the plurality of correction plates 83 is not limited to the above as long as the relative position and orientation of the plurality of correction plates 83 can be constantly maintained.

The plurality of correction plates 83 and the vapor deposition mask 70 are spaced apart from each other in the Z axis direction.

In Embodiment 2 as well, as in Embodiment 1, the vapor deposition particles 91 discharged from a vapor deposition source opening 61 pass through a first control space 81a, a second control space 81b and a mask opening 71 in this order adhere to the deposition surface 10e of the substrate 10, and form a stripe-shaped coating film 90 extending in the Y axis direction.

In Embodiment 2, because the correction plate 83 is disposed in each second control space 81b, the vapor deposition particles 91 necessarily pass through the spaces between the second control plates 80b and the correction plate 83 when passing through the second control space 81b.

As in Embodiment 1, in Embodiment 2 as well, on a projection onto the XZ plane, the control plates 80a and 80b limit the incidence angle of the vapor deposition particles 91 entering the mask openings 71. Accordingly, the width We of the blur portion 990e shown in FIG. 7 is reduced, and preferably the occurrence of the blur portions 990e will substantially be prevented, and thus the occurrence of blur at both edges of the stripe-shaped coating film 90 can be suppressed significantly. As a result, in the organic EL display device, the need to increase the width of the non-light-emitting region between light-emitting regions so as to not cause color mixing is eliminated. Accordingly, it is possible to achieve display of high definition and high brightness images. In addition, the need to increase the current density in the light emitting layers in order to enhance brightness is also eliminated, a long service life can be achieved and reliability can be improved.

Figure 19:
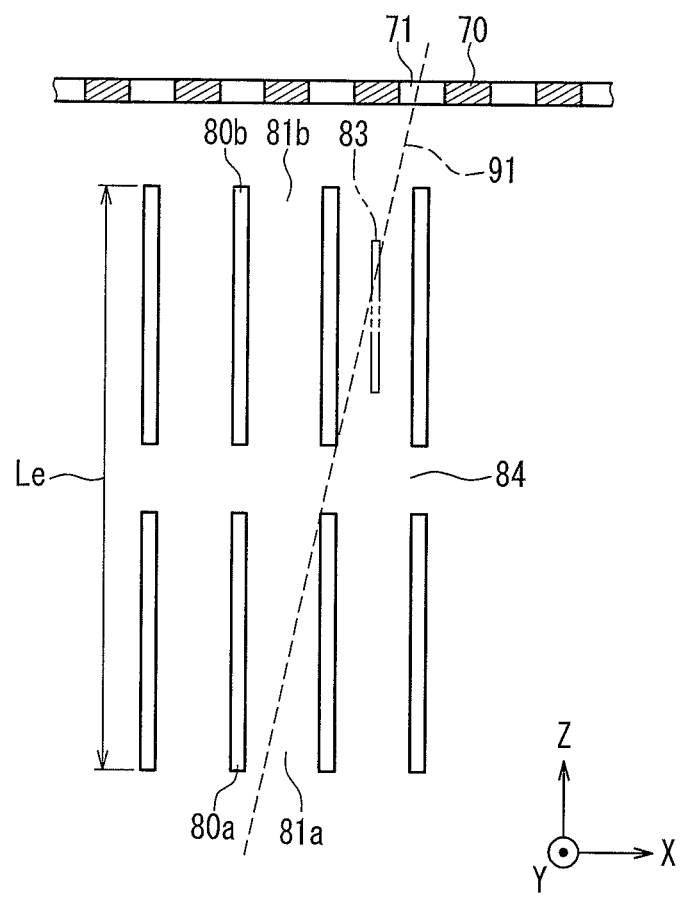
FIG. 19 is a diagram for illustrating the action of a correction plate in the vapor deposition device according to Embodiment 2 of the present invention.

A gap 84 is formed between the first control plate 80a and the second control plate 80 constituting each control plate column. Accordingly, as shown in FIG. 19, a situation may occur in which the vapor deposition particles 91 obliquely departing from a first control space 81a pass through the gap 84 and a second control space 81b other than the second control space 81b positioned directly above the first control space 81a, and enter a mask opening 71. The correction plate 83 captures such vapor deposition particles 91 that fly and pass through the gap 84. Accordingly, in Embodiment 2 as well, despite the fact that the gap 84 is formed between the first control plates 80a and the second control plates 80b, only the vapor deposition particles 91 that have passed through a first control space 81a and the second control space 81b positioned directly above the first control space 81a in this order can pass through the mask openings 71. Accordingly, in Embodiment 2 as well, the first control plate 80a and the second control plate 80b that are arranged along the Z axis direction and constitute a control plate column can be regarded as a single continuous control plate having an effective length Le.

As in Embodiment 1, the length in the Z axis direction (specifically, effective length Le) of a control plate column can be increased without reducing the interval between control plate columns in the X axis direction. Accordingly, it is possible to reduce the width We of the blur portion 990e without reducing the utilization efficiency of the vapor deposition material and without increasing the variation in the width of the blur portion.

Figure 20A:
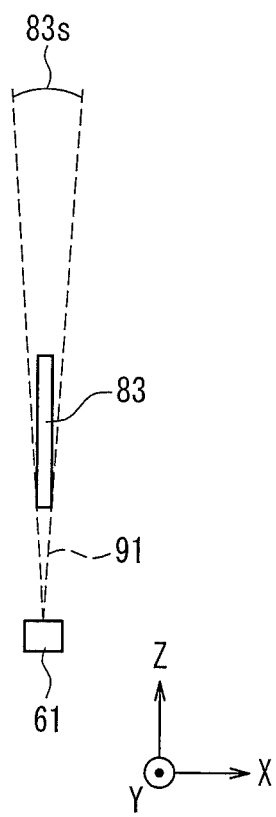
FIGS. 20A and 20B are diagrams for illustrating shadow effects of the correction plate in a vapor deposition device according to the present invention.
Figure 20B:
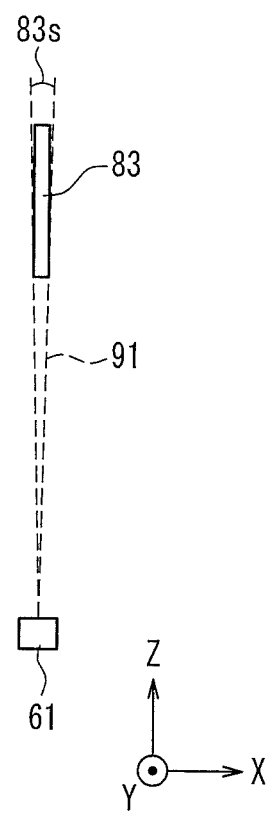

In Embodiment 2, the correction plates 83 are disposed at a position relatively far from the vapor deposition source openings 61 in the Z axis direction, as compared to Embodiment 1. As can be seen from the comparison between FIG. 20A in which the correction plate 83 is disposed near the vapor deposition source opening 61 and FIG. 20B in which the correction plate 83 is disposed far from the vapor deposition source opening 61, the farther the correction plate 83 is positioned in the Z axis direction from the vapor deposition source opening 61, the smaller the angle range 83s in which the flow of vapor deposition particles 91 are blocked by the correction plate 83. Accordingly, with Embodiment 2, the utilization efficiency of the vapor deposition material and the vapor deposition rate are improved, as compared to Embodiment 1.

In the above embodiment, an example was shown in which each correction plate 83 was disposed within a single second control space 81b, but the first and second control plates 80a and 80b can be designed, without using the correction plates 83, so as to prevent a situation in which the vapor deposition particles 91 departing from a first control space 81a pass through the gap 84 and a second control space 81b other than the second control space 81b positioned directly above the first control space 81a, and enter the mask openings 71. In this case, the correction plates 83 can be omitted.

Example 2 corresponding to Embodiment 2 of the present invention will be described. However, needless to say, the present invention is not limited to the following example.

Figure 21:
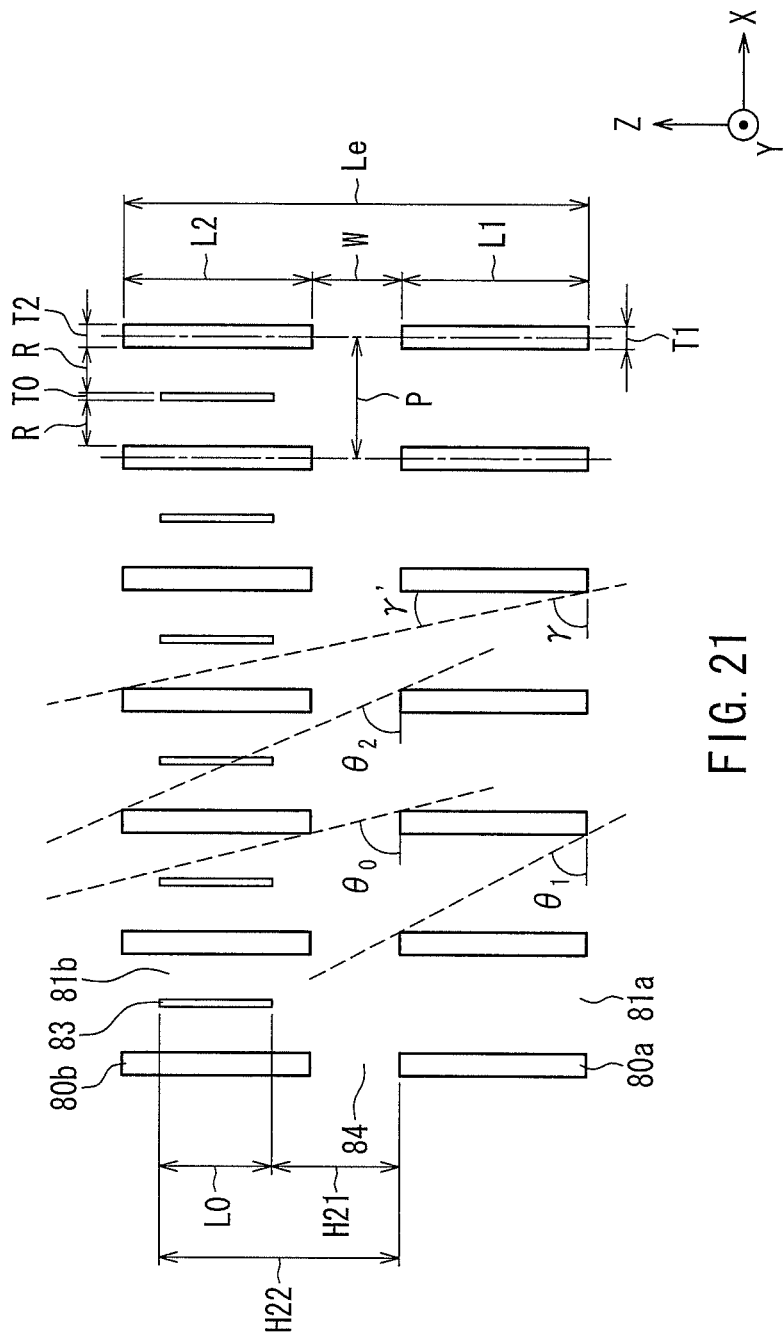
FIG. 21 is a partially enlarged front view showing a part of an arrangement of a first control plate, a second control plate, and the correction plate in Example 2 corresponding to Embodiment 1 according to the present invention.

FIG. 21 shows an enlarged view showing a part of control plates 80a and 80b and correction plates 83.

The dimensions, arrangement and material of the first control plates 80a and the second control plate 80b were the same as those used in Example 1.

A correction plate 83 was disposed at the center between two neighboring second control plates 80b in the X axis direction. The correction plate 83 had a length L0 in the Z axis direction of 45 mm, a length in the Y axis direction of 190 mm, and a dimension (thickness) T0 in the X axis direction of 0.2 mm. The correction plate 83 was disposed such that, in the Z axis direction, a distance H21 in the Z axis direction between the lower end of the gap 84 (specifically, the upper end of the first control plate 80a) and the lower end of the correction plate 83 was 40 mm, and a distance H22 in the Z axis direction between the lower end of the gap 84 and the upper end of the correction plate 83 was 85 mm. As a material of the correction plate 83, the same material for the first and second control plates 80a and 80b, namely, SUS 304 was used. A plurality of correction plates 83 were integrally held by a holding member 85b holding a plurality of second control plates 80b (see FIGS. 17 and 18).

In Example 2, a single correction plate 83 was provided in each second control space 81b, and thus a situation did not occur in which the vapor deposition particles 91 departing from a first control space 81a passed through the gap 84 and a second control space 81b other than the second control space 81b positioned directly above the first control space 81a, and enter the mask openings 71. That is, the first control plate 80a and the second control plate 80b arranged in the Z axis direction with the gap 84 therebetween are equivalent to a single control plate that is continuous in the Z axis direction without a gap 84 therebetween, and the effective length Le (Le=L1+W+L2) was 150 mm.

A light emitting layer was formed by forming a vapor deposition film made of an organic material in a desired pixel pattern on the deposition surface 10e of a substrate 1, in the same manner as in Example 1 except for the above difference.

As in Example 1, in Example 2 as well, the maximum incidence angle α of vapor deposition particles with respect to the substrate 10 was 2.9°, which was the same as the spread angle γ' of the vapor deposition particles limited by the first and second control plates 80a and 80b. Accordingly, the width We (see FIG. 7) of the blur portion of the coating film was as follows:

$$We = H \times \tan \alpha = 25\ \mu m.$$

The width We of the blur portion was smaller than the dimension in the X axis direction of a non-light-emitting region between neighboring light-emitting regions that were adjacent in the X axis direction. In addition, the lengths L1 and L2 of the first and second control plates 80a and 80b were as short as 70 mm, and thus there were almost no variations in the width We of the blur portion. Accordingly, the blur portion was successfully brought within the non-light-emitting region. That is, the vapor deposition particles did not adhere in the light-emitting region of a different color that was adjacent in the X axis direction, and thus it was possible to manufacture a high-quality organic EL display device without color mixing. Also, due to the width We of the blur portion and its variations being small, it was possible to reduce the dimension in the X axis direction of the non-light-emitting region so that the light-emitting region of the pixel was increased. Accordingly, the current density was reduced and degradation of the light emitting layer constituting the organic EL element was prevented, as a result of which luminescence lifetime characteristics of the pixels were improved, and a highly reliable organic EL display device was obtained.

Example 2 given above is merely exemplary, and can be changed as appropriate.

For example, the dimensions and arrangement of the correction plate 83 are not limited to the above example. However, it is necessary to design the correction plate 83 according to the design of the first and second control plates 80a and 80b, so as to avoid a situation in which the vapor deposition particles 91 departed from a first control space 81a pass through the gap 84 and then a second control space 81b other than the second control space 81b positioned directly above the first control space 81a and enter the mask openings 71. Specifically, the control plate 83 must satisfy the following conditions.

In FIG. 21, the angles θ0, θ1 and θ2 are defined by Equation 2-1 given below.

$$\tan \theta 0 = 2 \times W/(T1+T2)$$

$$\tan \theta 1 = L1/(P-T1)$$

$$\tan \theta 2 = 2 \times (W+L2)/(2 \times P+T1-T2) \quad \text{(Equation 2-1)}$$

The greater one of the angles θ1 and θ2 is set as angle ξ. Also, as shown in FIG. 21, the interval in the X axis direction between the second control plate 80b and the correction plate 83 is represented by R. The length in the Z axis direction of the correction plate 83 is represented by L0, the distance in the Z axis direction between the lower end of the gap 84 (specifically, the upper end of the first control plate 80a) and the lower end of the correction plate 83 is represented by H21, and the distance in the Z axis direction between the lower end of the gap 84 and the upper end of the correction plate 83 is represented by H22.

If ξ>θ0, (a)

L0=0 (in other words, the correction plate 83 is unnecessary)

If ξ<θ0, (b)

$$H22 \geq W + R \times \tan \theta 0$$

$$H21 \leq (R+T1) \times \tan \xi$$

$$L0 = H22 - H21 \geq W + R \times \tan \theta 0 - (R+T1) \times \tan \xi$$

Depending on the design of the first and second control plates 80a and 80b, as shown in (a) above, the correction plate 83 can be omitted. In other words, if (a) above is satisfied, the vapor deposition particles 91 do not pass through the gaps 84 even without the correction plate 83, and thus the effects of Embodiment 2 described above can be obtained.

In the above description, an example was shown in which two control plates 80a and 80b were disposed along the Z axis direction via a gap 84 therebetween, but the number of control plates disposed along the Z axis direction is not limited to two, and may be three or more. Regardless of the number of control plates, a correction plate needs to be installed if necessary so as to prevent the vapor deposition particles having passed through the gap 84 between two control plates that are opposed in the Z axis direction from adhering to the substrate 10. In this case, there is no particular limitation on the method for designing the correction plate, but as examples, two methods will be described below.

As a first method, a correction plate can be designed by applying Equation 2-1 above to gaps at different positions in the Z axis direction. Specifically, the first control plate and the second control plate according to Equation 2-1 are replaced with the nth control plate that is located at the nth position in the Z axis direction from the vapor deposition source 60 side and the (n+1)th control plate that is located at the (n+1)th position, and the nth correction plate with respect to the nth gap between the nth control plate and the (n+1)th control plate is designed by applying Equation 2-1 given above, where n is a positive integer. This processing is performed on all of the gaps.

Figure 22:
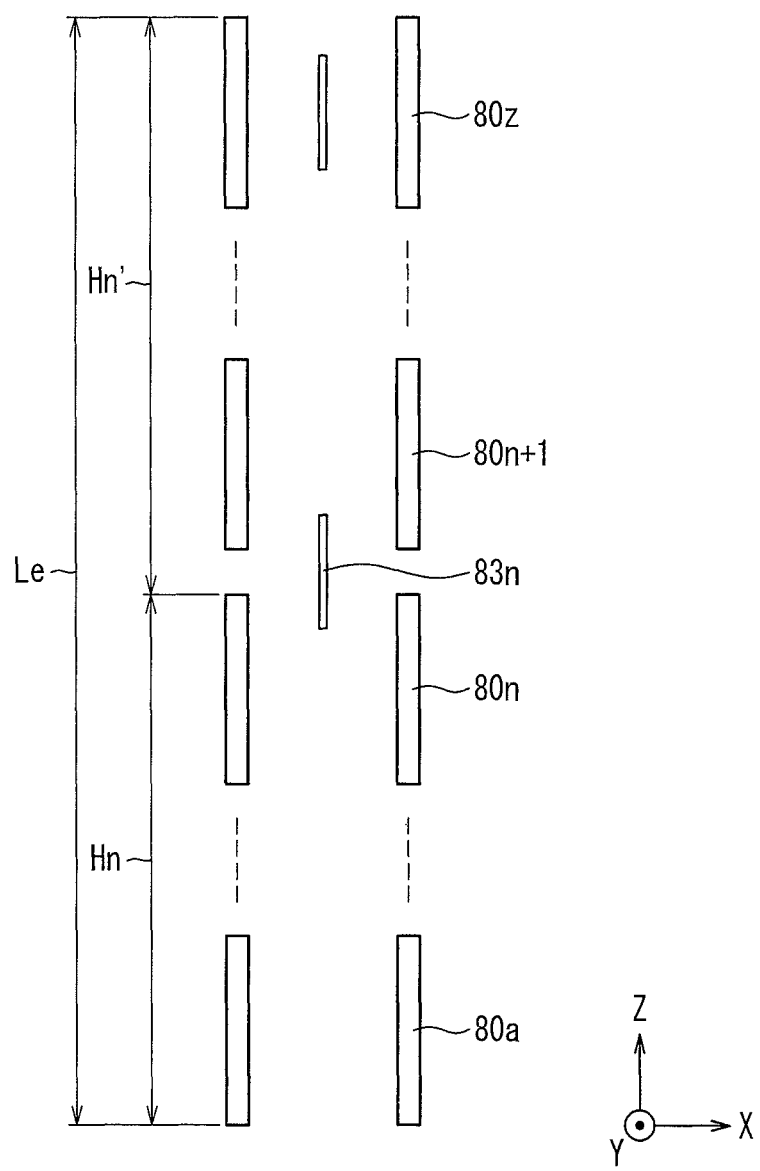
FIG. 22 is a diagram for illustrating a method for designing the correction plate, in the case where z control plates are disposed along the Z axis direction in Embodiment 2 according to the present invention.

The second method is as follows. As shown in FIG. 22, a case is considered in which a control plate column is constituted by z control plates disposed along the Z axis direction. The definitional equations of the angles θ1 and θ2 in Equation 2-1 are replaced as follows, where the distance in the Z axis direction between the lower end of the first control plate 80a at a position closest to the vapor deposition source and the upper end of the nth control plate 80n is represented by Hn, and the distance in the Z axis direction between the upper end of the nth control plate 80n and the upper end of the zth control plate 80z at a position closest to the vapor deposition mask is represented by Hn'.

$$\tan \Theta 1 = 2 \times Hn/(2 \times P - T1 - T_n)$$

$$\tan \Theta 2 = 2 \times Hn'/(2 \times P + T_n - T_z) \quad \text{(Equation 2-2)}$$

Here, $T_n$ and $T_z$ respectively represent the thickness of the nth control plate 80n and the thickness of the zth control plate 80z. Other than that, the nth correction plate 83n with respect to the nth gap between the nth control plate 80n and the (n+1)th control plate 80$_{n+1}$ is designed by replacing the first control plate and the second control plate according to Equation 2-1 given above with the nth control plate 80n and the (n+1)th control plate 80$_{n+1}$, and applying (a) or (b) above. According to this second method, the angles θ1 and θ2 can be increased, and thus design benefits can be obtained such as allowing the use of a single common control plate with respect to a plurality of gaps at different positions in the Z axis direction, or allowing the omission of a correction plate with respect to a certain gap.

In Embodiments 1 and 2 given above, the vapor deposition material that has been captured by and adhered to the surfaces of the control plates 80a and 80b and the correction plates 83 can be removed from the control plates 80a and 80b and the correction plates 83 and recovered by, for example, detaching the plurality of control plates 80a and 80b and the plurality of correction plates 83 from the vapor deposition device together with the holding bodies 85a and 85b and heating them so as to melt or sublimate the vapor deposition material. Accordingly, the vapor deposition material that has adhered to the control plates 80a and 80b and the correction plate 83 is not wasted, and thus the overall material utilization efficiency can be improved. In contrast, a shadow mask used in vapor deposition by color is generally made of an approximately 100 μm thick metal plate having a large number of fine openings formed therein, and is affixed to a frame under tension. Accordingly, when heated in the same manner as the control plates 80a and 80b and the correction plates 83 of the present invention are heated, the shadow mask may be deformed, making it difficult to use the shadow mask again. It was therefore difficult to recover the vapor deposition material that has adhered to the shadow mask. The control plates 80a and 80b and the correction plates 83 of the present invention have not undergone fine processing and receive no tension, and thus the above problems encountered with the shadow mask do not occur.

Also, in the present invention, in order to prevent the vapor deposition particles from entering the mask openings 71 at a large incidence angle, a part of the vapor deposition particles are captured by the control plates 80a and 80b and the correction plates 83, prior to the vapor deposition mask 70. Accordingly, in the present invention, the amount of vapor deposition material adhering to the vapor deposition mask (the inner circumferential surface of the mask openings in particular) is reduced as compared to the new vapor deposition method shown in FIG. 5 that does not use the control plates 80a and 80b and the correction plates 83. Accordingly, clogging of the mask openings is unlikely to occur, and thus the frequency of replacement of the vapor deposition mask due to adhesion of the vapor deposition material can be reduced.

In the present invention, it is preferable that the thickness of the correction plates 83 is as thin as possible. The thinner the thickness, the smaller the influence of shadow effect (the effect that the flow of vapor deposition particles is blocked by the correction plate 83, see FIGS. 20A and 20B) due to the thickness of the correction plate 83. Accordingly, the reduction in the utilization efficiency of the vapor deposition material and in the vapor deposition rate can be reduced. It is sufficient that the correction plate 83 is designed according to the design described in Examples 1 and 2, such that the vapor deposition particles passing through the gap 84 do not adhere to the substrate 10. Also, the shape and dimensions of the plurality of correction plates 83 do not need to precisely match. Accordingly, there is room for the design margin of the correction plates 83, as compared to the control plates, and thus it is possible to reduce the thickness of the correction plates 83.

In Embodiments 1 and 2 given above, regardless of the color (red, green, blue) of the organic light emitting layer material, vapor deposition by color is performed using similarly designed control plates 80a and 80b and correction plates 83, but the present invention is not limited thereto, and for example, the design of at least one of the control plates 80a, the control plates 80b and the correction plates 83 may be changed for each color. For example, in the case where no problem occurs in the characteristics even when a green light emitting layer material adheres to a neighboring pixel in a very small amount, a configuration can be used that allows the vapor deposition particles passing through the gap 84 to adhere to the substrate, without using the correction plates 83 during vapor deposition of green light emitting layer material.

In Embodiments 1 and 2 given above, each correction plate 83 is disposed at the center between a pair of neighboring control plates in the X axis direction. With this configuration, it is possible to, with the use of a single correction plate 83, restrict the passage of vapor deposition particles through a pair of gaps 84 positioned on both sides of the correction plate 83 in the X axis direction. Accordingly, the number of correction plates 83 can be minimized.

However, the present invention is not limited to the configuration described above. Specifically, the correction plate 83 may be disposed at a position displaced in the X axis direction from the center between a pair of neighboring control plates in the X axis direction. Also, a plurality of correction plates 83 may be disposed between a pair of neighboring control plates in the X axis direction. The position and number of correction plates 83 can be set as appropriate as long as the correction plates are designed such that the vapor deposition particles passing through the gap 84 between control plates that are opposed in the Z axis direction do not adhere to the substrate.

In Embodiments 1 and 2 given above, the control plates 80a and 80b and the correction plates 83 are disposed such that the major surfaces thereof are parallel to the YZ plane, but the present invention is not limited thereto. It is possible to, for example, dispose at least one of the plurality of first control plates 80a, the plurality of second control plates 80b, and the plurality of correction plates 83 such that the major surfaces thereof are parallel to the Y axis and inclined with respect to the deposition surface 10e of the substrate 10. It is thereby possible to cause the blur portions on both sides of the coating film 90 in the X axis direction to have different widths We. In this case, Equations 1-1, 1-2, 2-1 and 2-2 that define various angles of Examples 1 and 2 described above are changed according to the angle of inclination of the inclined control plates and/or correction plates.

The control plates and/or correction plates may be configured to be movable in the Z axis direction. Specifically, the plurality of control plates disposed in the X axis direction and/or the plurality of correction plates disposed in the X axis direction may be configured to be collectively movable in the Z axis direction. With this configuration, the effective length Le of a control plate column composed of a plurality of control plates arranged in the Z axis direction can be adjusted, and thus the width We of the blur portion can be adjusted. Because the design specifications of the pixels of organic EL display devices vary from device to device, the allowable width of the blur portion We may vary depending on the device. In such a case, if the effective length Le of the control plate column cannot be changed, a need arises for a replacement of the control plates for each device. This causes an increase in equipment cost due to preparation of control plates for each device and a reduction in the processing cycle time of the manufacturing apparatus due to replacement of the control plates, and the like, resulting in an increased manufacturing cost. Even the second new vapor deposition method described in FIGS. 9 and 10 requires replacement of the control plates 980 in order to change the width We of the blur portion, which was described above. By configuring the present invention such that the control plates and/or correction plates are movable in the Z axis direction, the above problem can be solved because the effective length Le of the control plate column can be adjusted by using control plates that are common to a plurality of types of devices, without replacement of the control plates. In the case where the control plates and/or correction plates are configured to be movable, however, care needs to be taken to avoid a situation in which the vapor deposition particles passing through the gap 84 between two control plates that are opposed in the Z axis direction reach the substrate.

In the present invention, the control plates may be cooled. A cooling device for cooling the control plates may be attached to the control plates or to the holding body (the holding body 85a, 85b) that holds the control plates so as to cool the control plates by heat conduction. There is no particular limitation on the cooling device, and for example, a water-cooling method can be used in which a coolant is passed through in a cooling pipe. Cooling the control plates suppresses an increase in the temperature of the control plates, as a result of which the vapor deposition particles that have collided with the control plates can be captured more reliably and re-vaporization of the vapor deposition particles from the control plates can be prevented. It is also possible to prevent the occurrence of a phenomenon such as deformation or dimensional changes of the control plates due to the control plates being heated by radiant heat from the vapor deposition source. As a result, the variations in the width We of the blur portion 990e can be further reduced.

The correction plates may be cooled in the same manner as described above in addition to the control plates or instead of the control plates. In this case, the above-described effects can be obtained.

Also, a temperature control device that adjusts the temperature of the control plates to a predetermined temperature may be provided. There is no particular limitation on the configuration of the temperature control device, and for example, the temperature control device can be configured with a heating device that heats the control plates, a cooling device that cools the control plates, and a temperature detecting device that detects the temperature of the control plates. The heating device and the cooling device may be attached to the control plates or to the holding body (the holding body 85a, 85b) that holds the control plates so as to heat or cool the control plates by heat conduction. There is no particular limitation on the heating device, and a known heater can be used, for example. There is no particular limitation on the cooling device, and for example, a water-cooling method can be used in which a coolant is passed through in a cooling pipe. By appropriately controlling the temperature of the control plates, the vapor deposition particles captured by the control plates can be caused to re-vaporize, whereby the material utilization efficiency can be further improved. However, the vapor deposition particles that have re-vaporized from the control plates may fly in various directions depending on the temperature and the like of the control plates. If the re-vaporized vapor deposition particles enter the substrate 10 at an angle larger than the desired maximum incidence angle α, an unwanted blur portion is formed at the edge of the coating film. Accordingly, it is preferable to control the amount of vapor deposition particles that re-vaporize and the flight direction of the vapor deposition particles by adjusting the temperature of the control plates.

A temperature control device that adjusts the temperature of the correction plates in addition to the control plates or instead of the control plates may be provided. In this case, the above-described effects can be obtained.

In Embodiments 1 and 2 given above, in the vapor deposition source 60, a plurality of vapor deposition source openings 61 having a nozzle shape are disposed at a constant pitch along the X axis direction, but the present invention is not limited thereto. For example, the opening shape of the vapor deposition source openings 61 having a nozzle shape as viewed in the Z axis direction is not limited to circular as described in the above examples, and may be elliptical, rectangular, square, and various polygonal shapes and the like. The pitch at which the plurality of vapor deposition source openings 61 are arranged in the X axis direction may be the same as the pitch at which a plurality of control plate columns are arranged in the X axis direction or may be different. The relative position of the vapor deposition source openings 61 in the X axis direction with respect to the control plate columns can be set as appropriate. It is also possible to dispose vapor deposition source openings having a slot shape parallel to the X axis direction, the slot shape being longer than the width between a plurality of control plate columns.

The shape of the control plates and the correction plates as viewed in the X axis direction does not necessarily have to be rectangular, and may be substantially trapezoidal with the vapor deposition source 60 side being short and the vapor deposition mask 70 side being long, for example. Also, the control plates and the correction plates do not necessarily have to be flat plates, and may be bent or curved or may be corrugated plates. Also, the thicknesses of the control plates and the correction plates do not necessarily have to be constant, and the control plates and the correction plates may have, for example, a tapered cross section that is thick on the vapor deposition source 60 side and thin on the vapor deposition mask 70 side.

There is no particular limitation on the method for making the plurality of control plates and the plurality of correction plates. For example, it may be possible to, for example, separately make the control plates and the correction plates, and fix them to a holding body 85a or 85b by means of welding or the like. Alternatively, a plurality of linearly aligned through holes are formed in a thick board, and the wall between each neighboring through holes may be used as the control plate and the correction plate.

The pattern of the mask openings 71 formed in the vapor deposition mask 70 is not limited to that of Examples 1 and 2 given above. All of the mask openings 71 may have the same shape and dimensions, or may have different shapes and dimensions. The pitch in the X axis direction of the mask openings 71 may be constant or different.

In the vapor deposition devices shown in Embodiments 1 and 2 above, the vapor deposition source openings 61, the control plates 80a and 80b, and the plurality of mask openings 71 are each aligned in the X axis direction, but the present invention is not limited thereto. For example, a plurality of rows extending in the X axis direction may be arranged in the Y axis direction, each row composed of at least one of the vapor deposition source openings, the control plates and the mask openings. In this case, the positions in the X axis direction of at least one of the vapor deposition source openings, the control plates and the mask openings may be the same or different between the plurality of rows.

In Embodiments 1 and 2 given above, the substrate 10 is moved relative to the vapor deposition unit 50 that is stationary, but the present invention is not limited thereto. It is sufficient that one of the vapor deposition unit 50 and the substrate 10 is moved relative to the other. For example, it may be possible to fix the position of the substrate 10 and move the vapor deposition unit 50. Alternatively, both the vapor deposition unit 50 and the substrate 10 may be moved.

In Embodiments 1 and 2 given above, the substrate 10 is disposed above the vapor deposition unit 50, but the relative positional relationship between the vapor deposition unit 50 and the substrate 10 is not limited thereto. It may be possible to, for example, dispose the substrate 10 below the vapor deposition unit 50 or dispose the vapor deposition unit 50 and the substrate 10 so as to oppose each other in the horizontal direction.

INDUSTRIAL APPLICABILITY

There is no particular limitation on the fields to which the vapor deposition device and vapor deposition method of the present invention can be applied, and the present invention is preferably used to form light emitting layers for use in organic EL display devices.

DESCRIPTION OF SYMBOLS

10 Substrate
10e Deposition Surface
20 Organic EL Element
23R, 23G, 23B Light Emitting Layer
50 Vapor Deposition Unit
56 Moving Mechanism
60 Vapor Deposition Source
61 Vapor Deposition Source Opening
70 Vapor Deposition Mask
71 Mask Opening 80a First Control Plate
80b Second Control Plate
81a First Control Space
81b Second Control Space
83 Correction Plate
84 Gap
90 Coating Film
91 Vapor Deposition Particle

The invention claimed is:

1. A vapor deposition method for forming a coating film having a predetermined pattern on a substrate, the method comprising
a vapor deposition step of forming the coating film by causing vapor deposition particles to adhere onto the substrate,
wherein the vapor deposition step is a step in which with the use of a vapor deposition unit including a vapor deposition source having a vapor deposition source opening that discharges the vapor deposition particles and a vapor deposition mask disposed between the vapor deposition source opening and the substrate, the vapor deposition particles that have passed through a plurality of mask openings formed in the vapor deposition mask are caused to adhere onto the substrate while one of the substrate and the vapor deposition unit is moved relative to the other in a state in which the substrate and the vapor deposition mask are spaced apart at a fixed interval, and
when a direction that is orthogonal to a normal line direction of the substrate and is orthogonal to a relative movement direction of the substrate and the vapor deposition unit is defined as a first direction and the normal line direction of the substrate is defined as a second direction,
a plurality of control plate columns are disposed in the first direction between the vapor deposition source opening and the vapor deposition mask, each control plate column including a first control plate and a second control plate arranged along the second direction from the vapor deposition source opening side to the vapor deposition mask side,
a correction plate is disposed in only one of a first control space between the neighboring first control plates in the first direction and a second control space between the neighboring second control plates in the first direction, and
the correction plate is disposed so as to prevent, among the vapor deposition particles discharged from the vapor deposition source opening, those that have passed through a gap between the opposing first control plate and second control plate in the second direction from adhering to the substrate and forming the coating film.

2. The vapor deposition method according to claim 1, wherein the correction plate is disposed only in the first control space and is not disposed in the second control space.

3. The vapor deposition method according to claim 1, wherein the correction plate is disposed only in the second control space and is not disposed in the first control space.

4. The vapor deposition method according to claim 2, wherein the correction plate is disposed at a center between the neighboring first control plates in the first direction.

5. The vapor deposition method according to claim 3, wherein the correction plate is disposed at a center between the neighboring second control plates in the first direction.

6. The vapor deposition method according to claim 1, wherein the correction plate is disposed on the substrate side of a lower end of the gap between opposing first control plate and second control plate in the second direction.

7. The vapor deposition method according to claim 1, wherein the correction plate is movable in the second direction.

8. A vapor deposition device that forms a coating film having a predetermined pattern on a substrate, the device comprising:
a vapor deposition unit including a vapor deposition source having a vapor deposition source opening that discharges vapor deposition particles for forming the coating film and a vapor deposition mask disposed between the vapor deposition source opening and the substrate, and
a moving mechanism that moves one of the substrate and the vapor deposition unit relative to the other in a state in which the substrate and the vapor deposition mask are spaced apart at a fixed interval,
wherein when a direction that is orthogonal to a normal line direction of the substrate and is orthogonal to a relative movement direction of the substrate and the vapor deposition unit is defined as a first direction and the normal line direction of the substrate is defined as a second direction,
a plurality of control plate columns are disposed in the first direction between the vapor deposition source opening and the vapor deposition mask, each control plate column including a first control plate and a second control plate arranged along the second direction from the vapor deposition source opening side to the vapor deposition mask side,
a correction plate is disposed in only one of a first control space between the neighboring first control plates in the first direction and a second control space between the neighboring second control plates in the first direction, and
the correction plate is disposed so as to prevent, among the vapor deposition particles discharged from the vapor deposition source opening, those that have passed through a gap between the opposing first control plate and second control plate in the second direction from adhering to the substrate and forming the coating film.

9. The vapor deposition device according to claim 8, wherein the correction plate is disposed only in the first control space and is not disposed in the second control space.

10. The vapor deposition device according to claim 8, wherein the correction plate is disposed only in the second control space and is not disposed in the first control space.

11. The vapor deposition device according to claim 9, wherein the correction plate is disposed at a center between the neighboring first control plates in the first direction.

12. The vapor deposition device according to claim 10, wherein the correction plate is disposed at a center between the neighboring second control plates in the first direction.

13. The vapor deposition device according to claim 8, wherein the correction plate is disposed on the substrate side of a lower end of the gap between opposing first control plate and second control plate in the second direction.

* * * * *